United States Patent
Ozawa

(10) Patent No.: US 9,147,860 B2
(45) Date of Patent: Sep. 29, 2015

(54) LIGHT EMITTING DEVICE, METHOD OF MANUFACTURING THE LIGHT EMITTING DEVICE, AND DISPLAY UNIT

(71) Applicant: Joled Inc., Tokyo (JP)

(72) Inventor: Nobuo Ozawa, Kanagawa (JP)

(73) Assignee: Joled Inc., Tokyo (JP)

( * ) Notice: Subject to any disclaimer, the term of this patent is extended or adjusted under 35 U.S.C. 154(b) by 0 days.

(21) Appl. No.: 14/271,043

(22) Filed: May 6, 2014

(65) Prior Publication Data

US 2014/0339521 A1 Nov. 20, 2014

(30) Foreign Application Priority Data

May 17, 2013 (JP) .................. 2013-105407

(51) Int. Cl.
*H01L 51/52* (2006.01)
*H01L 27/32* (2006.01)

(52) U.S. Cl.
CPC ........ *H01L 51/5253* (2013.01); *H01L 51/5228* (2013.01); *H01L 27/322* (2013.01); *H01L 27/3244* (2013.01); *H01L 51/5218* (2013.01)

(58) Field of Classification Search
CPC ...... H01L 51/5203; H01L 51/56; H01L 27/32
USPC ............................................. 257/40; 438/46
See application file for complete search history.

(56) References Cited

U.S. PATENT DOCUMENTS

| 2006/0035087 A1* | 2/2006 | Yadav et al. ............... 428/411.1 |
| 2010/0091231 A1* | 4/2010 | Nishimura et al. .......... 349/139 |
| 2014/0284590 A1* | 9/2014 | Nakazawa et al. ............. 257/40 |

FOREIGN PATENT DOCUMENTS

| JP | 2002-033198 | 1/2002 |
| JP | 2011-103205 | 5/2011 |

* cited by examiner

*Primary Examiner* — Karen Kusumakar
*Assistant Examiner* — Adam S Bowen
(74) *Attorney, Agent, or Firm* — K&L Gates LLP

(57) ABSTRACT

A light emitting device having a stacked structure is provided. The stacked structure includes, in recited order: a first electrode layer; an organic layer including a light emitting layer; a second electrode layer; a consecutive conductive sealing layer; and a third electrode layer.

23 Claims, 20 Drawing Sheets

LIGHT EMITTING DEVICE, METHOD OF MANUFACTURING THE LIGHT EMITTING DEVICE, AND DISPLAY UNIT

CROSS REFERENCES TO RELATED APPLICATIONS

The present application claims priority to Japanese Priority Patent Application JP 2013-105407 filed in the Japan Patent Office on May 17, 2013, the entire content of which is hereby incorporated by reference.

BACKGROUND

The present application relates to a self-luminous light emitting device including an organic layer, a method of manufacturing the light emitting device, and a display unit including the light emitting device.

Recently, an organic EL display using a self-luminous light emitting device including an organic layer has been put to practical use. The organic EL display is of a self-luminous type, and therefore has a wide viewing angle compared with, for example, a liquid crystal display, and is sufficiently responsive to a high-definition and high-speed video signal.

Previously, the organic light emitting device has been tried to be improved in display performance through control of light generated in a light emitting layer, such as improvement in color purity of emission light or improvement in light emission efficiency by introducing a resonator structure. For example, the organic light emitting device may adopt a structure where a first electrode layer, an organic layer, and a second electrode layer are stacked in this order on a substrate with a drive circuit including a drive transistor, etc. in between. In the organic light emitting device of a top emission type, the second electrode layer is configured of a transparent conductive material, and light from the organic layer is multiply-reflected between the first and the second electrode layers, so that the light is extracted from a surface (top) on a side opposite to the substrate. The transparent conductive material used for the second electrode layer typically has a higher resistance value than a metal material. Hence, in a relatively large light emitting device, display performance may be reduced towards a central region from an end region of a display section due to voltage drop. When thickness of the second electrode layer is increased, voltage drop in a display plane is reduced due to a decrease in resistance value, but visible-light transmittance of the second electrode layer is decreased, and light extraction efficiency of the light emitting device is reduced.

To solve such difficulties, there is provided techniques of reducing voltage drop in the second electrode layer, for example, by connecting the second electrode layer to an auxiliary electrode provided on a second substrate via a conductor, a conductive rib, or a conductive resin layer (for example, see Japanese Unexamined Patent Application Publication Nos. 2002-033198 and 2011-103205 (JP-A-2002-033198 and JP-A-2011-103205)).

SUMMARY

However, the techniques of JP-A-2002-033198 and JP-A-2011-103205 each lead to an additional step of forming the conductor or the rib, which results in a complicated manufacturing process, and is disadvantageous in cost.

It is desirable to provide a light emitting device that has excellent mass-productivity and high light emitting performance, a method of manufacturing the light emitting device, and a display unit including such a light emitting device and having excellent display performance.

According to an embodiment of the present disclosure, there is provided a light emitting device having a stacked structure. The stacked structure includes, in recited order: a first electrode layer; an organic layer including a light emitting layer; a second electrode layer; a conductive sealing layer; and a third electrode layer.

According to an embodiment of the present disclosure, there is provided a display unit. The display unit includes a plurality of light emitting devices on a substrate. Each of the plurality of light emitting devices has a stacked structure. The stacked structure includes, in recited order, a first electrode layer, an organic layer including a light emitting layer, a second electrode layer, a conductive sealing layer, and a third electrode layer.

According to an embodiment of the present disclosure, there is provided a method of manufacturing a light emitting device. The method includes: forming a stack of a first electrode layer, an organic layer including a light emitting layer, and a second electrode layer in this order on a first substrate; forming a third electrode layer on a second substrate; and bonding the second electrode layer to the third electrode layer with a conductive sealing layer therebetween.

In the light emitting device, the method of manufacturing the light emitting device, and the display unit according to the above-described respective embodiments of the present disclosure, the second electrode layer is connected to the third electrode layer with the conductive sealing layer therebetween. The voltage drop in the second electrode layer is therefore reduced. In addition, the light emitting device has a simple configuration, and is therefore excellent in productivity.

According to the light emitting device, the method of manufacturing the light emitting device, and the display unit in the above-described respective embodiments of the present disclosure, a space between the second electrode layer and the third electrode layer is sealed by the conductive sealing layer. As a result, it is possible to reduce voltage drop in an in-plane direction without reducing light transmittance though the light emitting device has a simple configuration. Consequently, even if the light emitting device is increased in size, the light emitting device is excellent in mass-productivity, and secures high operation performance and reliability.

It is to be understood that both the foregoing general description and the following detailed description are exemplary, and are intended to provide further explanation of the technology as claimed.

Additional features and advantages are described herein, and will be apparent from the following Detailed Description and the figures.

BRIEF DESCRIPTION OF THE FIGURES

The accompanying drawings are included to provide a further understanding of the disclosure, and are incorporated in and constitute a part of this specification. The drawings illustrate embodiments and, together with the specification, serve to explain the principles of the technology.

FIG. 10 is a plan diagram illustrating a schematic configuration of a module including the display unit of FIG. 1 or the like.

FIG. 11A is a perspective diagram illustrating appearance of application example 1 of the display unit of FIG. 1 or the like.

FIG. 18 is a cross-sectional diagram illustrating another example of an organic layer illustrated in FIG. 1 or the like.

DETAILED DESCRIPTION

Hereinafter, some embodiments of the present disclosure will be described in detail with reference to the accompanying drawings. It is to be noted that description is made in the following order.

1. First Embodiment
A display unit in which a space between a second electrode layer and a third electrode layer is sealed by a conductive sealing layer including a transparent resin having conductive nanoparticles dispersed therein.

2. Modification of First Embodiment
A display unit in which a space between a second electrode layer and a third electrode layer is sealed by a conductive sealing layer including a transparent resin having conductive fillers dispersed therein.

3. Second Embodiment
A display unit in which an auxiliary wiring layer is selectively provided in a device separation region.

4. Application Examples
A module including a display unit, and electronic units each incorporating the module.

First Embodiment

Overall Configuration of Display Unit 1

Figure 1:
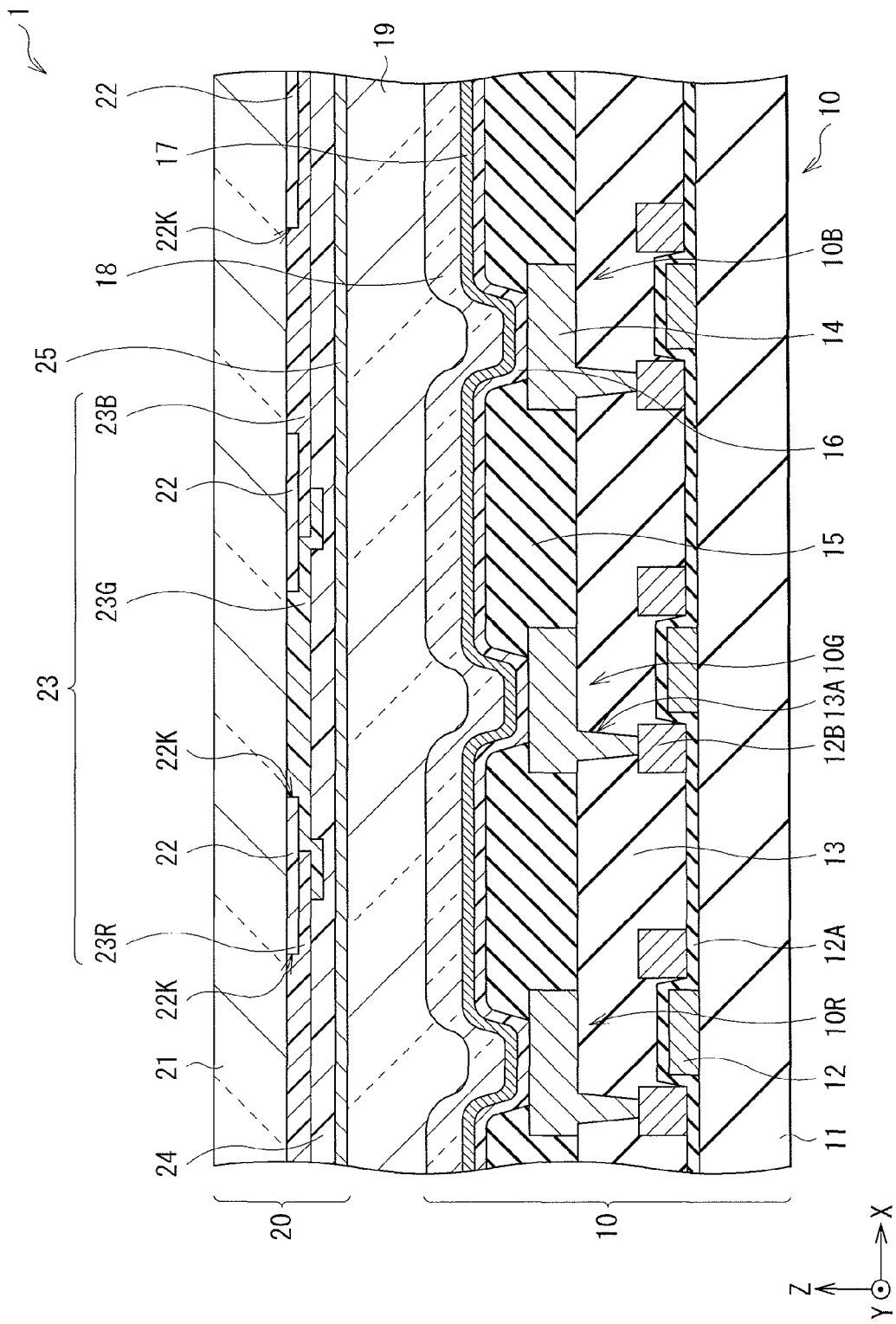
FIG. 1 is a cross-sectional diagram illustrating a configuration of a display unit according a first embodiment of the present application.

FIG. 1 illustrates a relevant-part sectional configuration of an organic EL display unit (display unit 1) as a first embodiment of the present application. The display unit 1 includes a device panel 10 and a sealing panel 20, and is of a so-called top emission type where light is extracted through the sealing panel 20.

The device panel 10 includes a device substrate 11 (first substrate) provided thereon with a lower structure of an organic light emitting device 10R generating red light, a lower structure of an organic light emitting device 10G generating green light, and a lower structure of an organic light emitting device 10B generating blue light. Here, the lower structure refers to, for example, a stacked structure configured of a first electrode layer 14, an organic layer 16, a high-resistance layer 17, and a second electrode layer 18. TFT 12 and a planarization layer 13 are provided between the lower structure of each of the organic light emitting devices 10R, 10G, and 10B and the device substrate 11. The lower structure of each of the organic light emitting devices 10R, 10G, and 10B is covered with a conductive sealing layer 19 provided between the lower structure and the sealing panel 20. The sealing panel 20 includes a sealing substrate 21 (second substrate) opposed to the device substrate 11. The sealing substrate 21 has a surface opposed to the device substrate 11, where a light shielding layer 22, a color filter 23, an overcoat layer 24, and a third electrode layer 25 are provided in this order on the surface.

In the display unit 1, the third electrode layer 25 of the sealing panel 20 is electrically connected to the second electrode layer 18 of the device panel 10 with the conductive sealing layer 19 therebetween.

Figure 2:
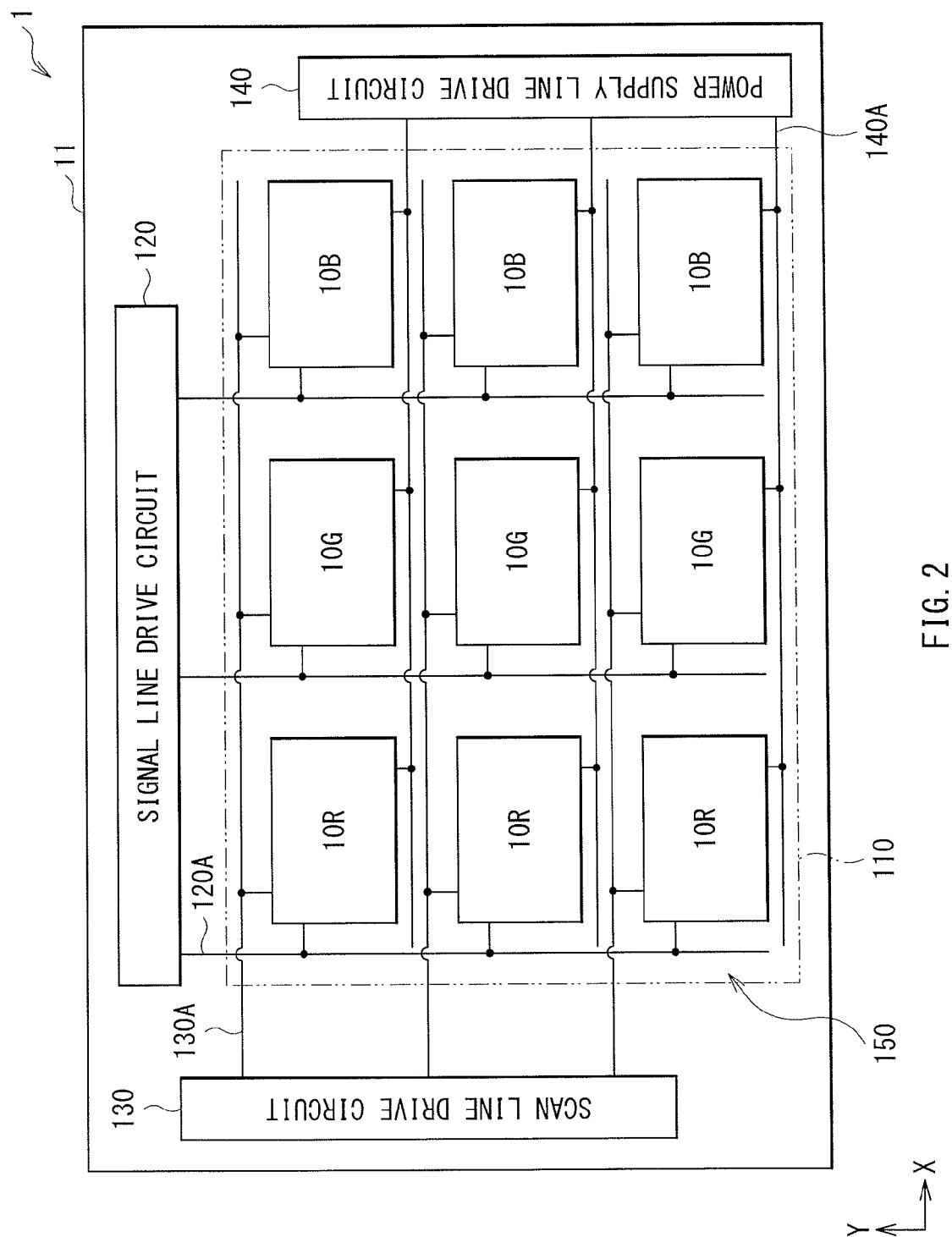
FIG. 2 is a diagram illustrating an overall configuration of the display unit illustrated in FIG. 1.

FIG. 2 illustrates an overall configuration of the display unit 1. The display unit 1 includes a display region 110, in the central portion of which the organic light emitting devices 10R, 10G, and 10B are two-dimensionally arranged in a matrix. For example, the periphery of the display region 110 may be provided with, as drivers for image display, a signal line drive circuit 120, a scan line drive circuit 130, and a power supply line drive circuit 140.

The display region 110 has the plurality of organic light emitting devices 10R, 10G, and 10B, and a pixel drive circuit 150 for driving such organic light emitting devices. In the pixel drive circuit 150, a plurality of signal lines 120A (120A1, 120A2, . . . , 120Am, . . . ) are disposed in a column direction (Y direction), while a plurality of scan lines 130A (130A1, 130A2, . . . , 130Am, . . . ) and a plurality of power supply lines 140A (140A1, 140A2, . . . , 140Am, . . . ) are disposed in a row direction (X direction). The organic light emitting devices 10R, 10G, and 10B are each provided at an intersection of the signal line 120A and the scan line 130A. The signal line 120A is connected at its two ends to the signal line drive circuit 120, the scan line 130A is connected at its two ends to the scan line drive circuit 130, and the power supply line 140A is connected at its two ends to the power supply line drive circuit 140.

The signal line drive circuit 120 supplies a signal voltage of an image signal corresponding to luminance information supplied from an undepicted signal supply source to one of the organic light emitting devices 10R, 10G, and 10B selected via the signal line 120A. The scan line drive circuit 130 may include a shift register, which sequentially shifts (transfers) a start pulse in synchronization with a received clock pulse, and the like. When an image signal is written to each of the organic light emitting devices 10R, 10G, and 10B, the scan line drive circuit 130 scans the organic light emitting devices 10R, 10G, and 10B on a row basis, and sequentially supplies a scan signal to the individual scan lines 130A. The signal line 120A receives a signal voltage from the signal line drive circuit 120, and the scan line 130A receives a signal voltage from the scan line drive circuit 130.

The power supply line drive circuit 140 includes a shift register, which sequentially shifts (transfers) a start pulse in synchronization with a received clock pulse, and the like. The power supply line drive circuit 140 appropriately supplies one of a first potential and a second potential different from each other to each of the power supply lines 140A from two ends thereof in synchronization with row-based scan by the scan line drive circuit 130. As a result, a transistor Tr1 described later is selected to be conductive or nonconductive.

Figure 3:
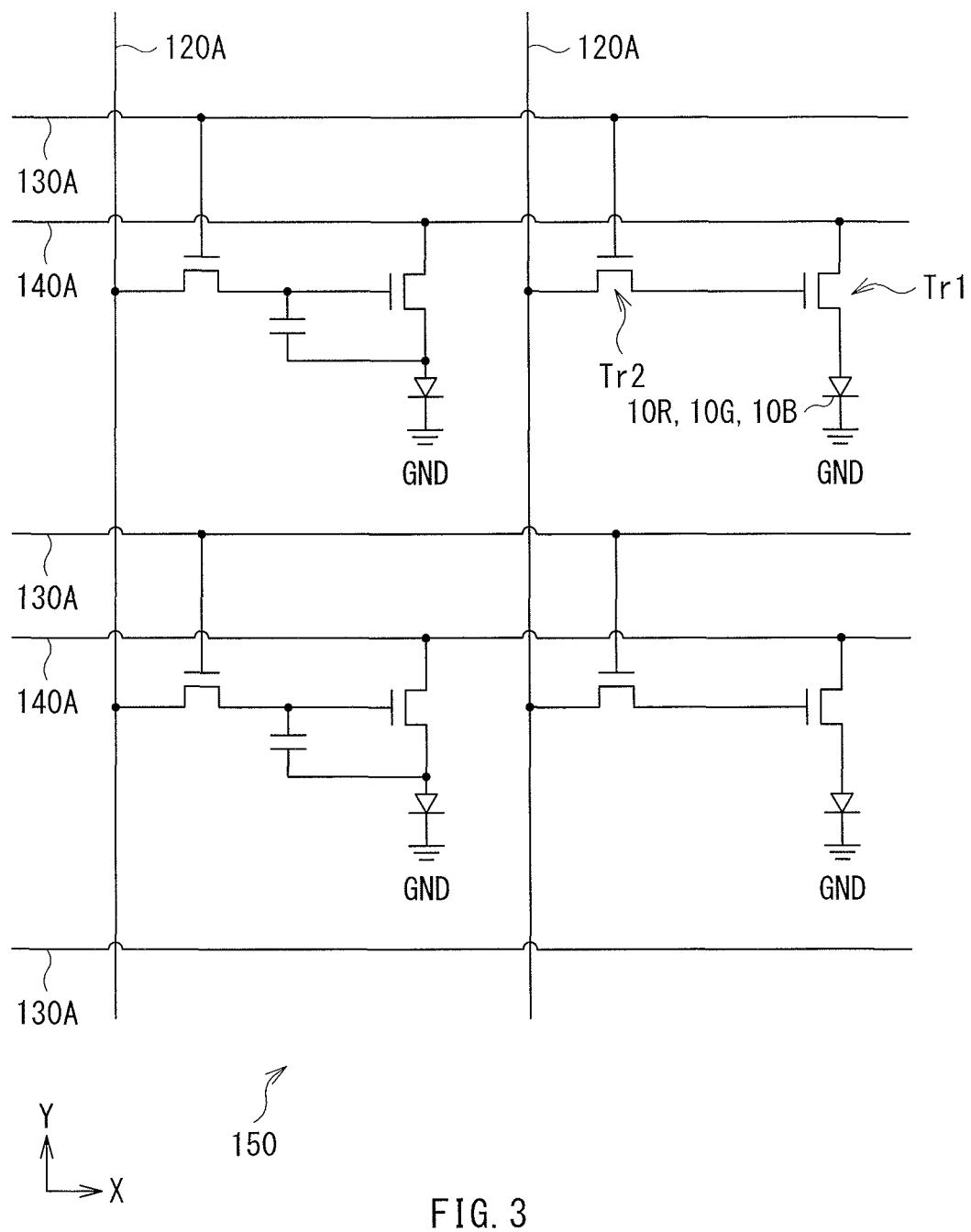
FIG. 3 is a diagram illustrating an example of a pixel drive circuit illustrated in FIG. 2.

FIG. 3 illustrates an exemplary configuration of the pixel drive circuit 150. The pixel drive circuit 150 is of an active type, and includes a transistor Tr1, a transistor Tr2, a capacitor (holding capacitance) Cs, and the organic light emitting devices 10R, 10G, and 10B. The organic light emitting devices 10R, 10G, and 10B are each connected in series to the transistor Tr1 between the power supply line 140A and a common power supply line (GND). Each of the transistor Tr1 and the transistor Tr2 may be of an inversely-staggered structure (a so-called bottom gate type) or of a staggered structure (a top gate type).

For example, a drain electrode of the transistor Tr2 may be connected to the signal line 120A so as to receive an image signal from the signal line drive circuit 120. A gate electrode of the transistor Tr2 may be connected to the scan line 130A so as to receive a scan signal from the scan line drive circuit 130. Furthermore, a source electrode of the transistor Tr2 may be connected to the gate electrode of the drive transistor Tr1.

For example, a drain electrode of the transistor Tr1 may be connected to the power supply line 140A so as to be set to one of the first potential and the second potential from the power supply line drive circuit 140. A source electrode of the transistor Tr1 may be connected to the organic light emitting devices 10R, 10G, and 10B.

The holding capacitance Cs is provided between the gate electrode of the transistor Tr1 (the source electrode of the transistor Tr2) and the source electrode of the transistor Tr1.

[Relevant-Part Configuration of Display Unit 1]

Refer to FIG. 1 again, a detailed configuration of each of the device panel 10 and the sealing panel 20 is described.

For example, the device substrate 11 may be formed of a glass or plastic material capable of blocking permeation of water (water vapor) and oxygen. The device substrate 11 is a support having a main surface on which the organic light emitting devices 10R, 10G, and 10B are arranged. Examples of a constitutional material of the device substrate 11 include a glass substrate including high-strain-point glass, soda glass ($Na_2O.CaO.SiO_2$), borosilicate glass ($Na_2O.B_2O_3.SiO_2$), forsterite ($2MgO.SiO_2$), and lead glass ($Na_2O.PbO.SiO_2$), a quartz substrate, and a silicon substrate. The device substrate 11 may be configured of such a glass substrate, a quartz substrate, or a silicon substrate while an insulating film is provided on a surface thereof. The device substrate 11 may be formed of a metal foil, a resin film, or a resin sheet. Examples of a material of the resin include organic polymers such as polymethylmethacrylate (PMMA), polyvinyl alcohol (PVA), polyvinyl phenol (PVP), polyether sulfone (PES), polyimide, polycarbonate, polyethylene terephthalate (PET), and polyethylene naphthalate (PEN). In the case of the top emission type, since light is extracted through the sealing substrate 21, the device substrate 11 may be formed of either a transmissive material or a non-transmissive material. The sealing substrate 21 may be formed of a material that is equal to or different from the material of the device substrate 11. The device substrate 11 may be configured of a flexible material.

For example, the TFT 12 may be a transistor corresponding to one of the transistors Tr1 and Tr2, and may serve as an active element for each of the organic light emitting devices 10R, 10G, and 10B. For example, the source electrode and the drain electrode of the TFT 12 are electrically connected to a wiring 12B via an interlayer insulating film 12A formed of silicon oxide or the like. When the TFT 12 is configured of, for example, the transistor Tr2, the wiring 12B may be connected to the signal line 120A. When the TFT 12 is configured of, for example, the transistor Tr1, the wiring 12B may be connected to (the first electrode layer 14 of) each of the organic light emitting devices 10R, 10G, and 10B via a connection hole 13A of the planarization layer 13. For example, an organic material such as polyimide, or an inorganic material such as silicon oxide ($SiO_2$) and silicon nitride (SiN) may be used for the interlayer insulating film 12A. For example, a $SiO_2$-based material such as boro-phosphosilicate glass (BPSG), PSG, BSG, AsSG, SiON, spin on glass (SOG), low-melting-point glass, and glass paste may be used for the interlayer insulating film 12A. For example, the wiring 12B may be formed of aluminum (Al), aluminum-copper (Cu) alloy, or the like.

The planarization layer 13 planarizes a surface, on which the TFT 12 is provided, of the device substrate 11, and is preferably configured of a material that is excellent in patterning accuracy, since the small connection hole 13A for connection between the wiring 12B and the first electrode layer 14 is to be formed therein. When a material having low water absorption is used for the planarization layer 13, it is possible to prevent degradation in organic light emitting devices 10R, 10G, and 10B due to water. For example, an organic material such as polyimide may be used for the planarization layer 13. It is possible to suppress degradation of the TFT 12 through adding a function of shielding blue light or ultraviolet (UV) light to the planarization layer 13.

Each of the organic light emitting devices 10R, 10G, and 10B includes the first electrode layer 14, the organic layer 16 including a light emitting layer, the high-resistance layer 17, the second electrode layer 18, the conductive sealing layer 19, and the third electrode layer 25 stacked in this order on the device substrate 11 (the planarization layer 13). An insulating film 15 is disposed between adjacent two of the organic light emitting devices 10R, 10G, and 10B. Arrangement of the organic light emitting devices 10R, 10G, and 10B is not particularly limited, and, for example, stripe arrangement, diagonal arrangement, delta arrangement, or rectangle arrangement may be adopted as the arrangement.

Since the first electrode layer 14 is provided in correspondence to each of the organic light emitting devices 10R, 10G, and 10B, a plurality of first electrode layers 14 are disposed separately from one another on the planarization layer 13. For example, the first electrode layer 14 may have a function of an anode electrode together with a function of a reflective layer, and is desirably configured of a material having a high reflective index and high hole injection performance. For example, such a first electrode layer 14 may have a thickness in a stacking direction (hereinafter, simply referred to as thickness) of 0.1 μm to 1 μm both inclusive. Examples of the material of the first electrode layer 14 may include single substances of metal elements such as chromium (Cr), gold (Au), platinum (Pt), nickel (Ni), copper (Cu), molybdenum (Mo), tungsten (W), titanium (Ti), tantalum (Ta), aluminum (Al), iron (Fe), and silver (Ag), and alloys thereof. The first electrode layer 14 may be a stack of such metal films. Ag—Pd—Cu alloy containing Ag, palladium (Pd) of 0.3 wt % to 1 wt % both inclusive, and Copper of 0.3 wt % to 1 wt % both inclusive, or Al-neodymium (Nd) alloy may be used for the first electrode layer 14. Although a material having a high work function is preferably used for the first electrode layer 14, a metal having a low work function such as aluminum or aluminum alloy may also be used for the first electrode layer 14 through appropriately selecting the organic layer 16 (in particular, a hole injection layer described later).

A region from a surface (a surface opposed to the second electrode layer 18) to a side face of the first electrode layer 14 is covered with the insulating film 15 that has an opening defining a light emitting region of each of the organic light emitting devices 10R, 10G, and 10B. The insulating film 15 accurately controls the light emitting region into a desired shape, and secures insulation between the first electrode layer 14 and the second electrode layer 18. For example, an organic material such as polyimide, or an inorganic material such as silicon oxide ($SiO_2$), silicon nitride (SiN), and silicon oxynitride (SiN) may be used for the insulating film 15. Thickness of the insulating film 15 may be, for example, 50 nm to 2500 nm both inclusive.

For example, the organic layer 16 may be provided in common to all the organic light emitting devices 10R, 10G, and 10B, and may include a hole injection layer, a hole transport layer, the light emitting layer, an electron transport layer, and an electron injection layer, all of which are not shown, in this order of closeness to the first electrode layer 14. The organic layer 16 may be configured of the hole transport layer, the light emitting layer, and the electron transport layer. In this case, the light emitting layer may also serve as the electron transport layer. The organic layer 16 may be configured of such sequential stacked structures (so-called tandem units) being multiply laminated with a connection layer therebetween. For example, the tandem unit may be provided for each of colors of red, green, and blue, and the organic layer 16 may be configured of a stack of such tandem units.

The hole injection layer improves hole injection efficiency, and also serves as a buffer layer that prevents leakage. For example, the hole injection layer may have a thickness of 1 nm to 300 nm both inclusive, and may be configured of a hexa-aza-triphenylene derivative shown by Chemical Formula 1 or 2.

[Chemical Formula 1]

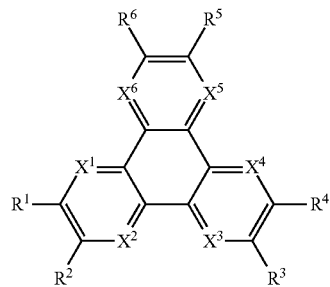

(where R1 to R6 each independently represent a substituent group selected from hydrogen, halogen, a hydroxyl group, an amino group, an arylamino group, a substituted or non-substituted carbonyl group having 20 or less carbons, a substituted or non-substituted carbonyl ester group having 20 or less carbons, a substituted or non-substituted alkyl group having 20 or less carbons, a substituted or non-substituted alkenyl group having 20 or less carbons, a substituted or non-substituted alkoxyl group having 20 or less carbons, a substituted or non-substituted aryl group having 30 or less carbons, a substituted or non-substituted heterocyclic group having 30 or less carbons, a nitrile group, a cyano group, a nitro group, and a silyl group, and adjacent Rm (m=1 to 6) may be bonded to each other through a ring structure. X1 to X6 each independently represent a carbon atom or a nitrogen atom.)

[Chemical Formula 2]

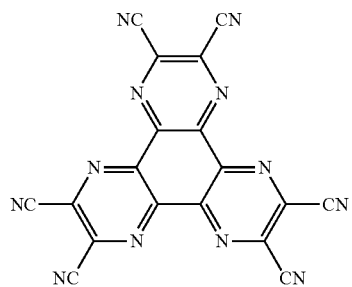

The hole transport layer improves hole transport efficiency to the light emitting layer. For example, the hole transport layer may have a thickness of about 40 nm, and may be configured of 4,4',4''-Tris(3-methylphenylphenylamino) triphenylamine (m-MTDATA) or α-naphthyl phenyl diamine (αNPD).

The light emitting layer may be, for example, a light emitting layer for white light emission, and, for example, may have a stack of the red light emitting layer, the green light emitting layer, and the blue light emitting layer, all of which are not shown, between the first electrode layer 14 and the second electrode layer 18. When an electric field is applied to each of the red light emitting layer, the green light emitting layer, and the blue light emitting layer, some of holes injected from the first electrode layer 14 through the hole injection layer and the hole transport layer are recombined with some of electrons injected from the second electrode layer 18 through the electron injection layer and the electron transport layer, and the red, green, and blue light emitting layers generate light of red, green, and blue, respectively.

For example, the red light emitting layer may include one or more of a red light emitting material, a hole transport material, an electron transport material, and a positive-and-negative charge transport material. The red light emitting material may be a fluorescent or phosphorescent material. For example, the red light emitting layer may have a thickness of about 5 nm, and may be configured of 4,4'-Bis(2,2-diphenylvinyl)biphenyl (DPVBi) mixed with 30 wt % of 2,6-bis[(4'-methoxydiphenylamino)styryl]-1,5-dicyanonaphthalene (BSN).

For example, the green light emitting layer may include one or more of a green light emitting material, a hole transport material, an electron transport material, and a positive-and-negative transport material. The green light emitting material may be a fluorescent or phosphorescent material. For example, the green light emitting layer may have a thickness of about 10 nm, and may be configured of DPVBi mixed with 5 wt % of coumarin 6.

For example, the blue light emitting layer may include one or more of a green light emitting material, a hole transport material, an electron transport material, and a positive-and-negative transport material. The blue light emitting material may be a fluorescent or phosphorescent material. For example, the blue light emitting layer may have a thickness of about 30 nm, and may be configured of DPVBi mixed with 2.5 wt % of 4,4-bis[2-(4-(N,N-diphenylamino)phenyl) vinyl] biphenyl (DPAVBi).

The electron transport layer improves electron transport efficiency to the light emitting layer, and, for example, may be configured of 8-hydroxyquinoline aluminium (Alq3) having a thickness of about 20 nm. The electron injection layer improves electron injection efficiency to the light emitting layer, and, for example, may be configured of LiF, $LiO_2$, or the like having a thickness of about 0.3 nm.

The high-resistance layer 17 prevents occurrence of short circuit between the first electrode layer 14 and the second electrode layer 18, and is provided in common to all the organic EL devices 10R, 10G, and 10B. The high-resistance layer 17 has a higher electric resistance than each of the first electrode layer 14 and the second electrode layer 18, and may have an electron transport function or an electron injection function. When a particle (foreign substance) or a protruding object is unintentionally attached on the first electrode layer 14, and when the organic EL devices 10R, 10G, and 10B are formed in such a state, short circuit may occur due to contact of the first electrode layer 14 to the second electrode layer 18. The high-resistance layer 17 makes it possible to prevent such contact of the first electrode layer 14 to the second electrode layer 18.

For example, the high-resistance layer 17 may be preferably configured of a material having an electrical resistivity of $1\times10^6$ Ω·m to $1\times10^8$ Ω·m both inclusive. This is because it is possible to sufficiently prevent occurrence of short circuit and control a drive voltage to be low as long as the electrical resistivity is within such a range. For example, the high-resistance layer 17 may be configured of one of niobium oxide ($Nb_2O_5$), titanium oxide ($TiO_2$), molybdenum oxide ($MoO_2$ or $MoO_3$), tantalum oxide ($Ta_2O_5$), hafnium oxide (HfO), magnesium oxide (MgO), $InGaZnO_x$ (IGZO), a mixture of niobium oxide and titanium oxide, a mixture of titanium oxide and zinc oxide (ZnO), a mixture of silicon oxide ($SiO_2$) and tin oxide ($SnO_2$), and a mixture of zinc oxide and one or more of magnesium oxide, silicon oxide, and aluminum oxide ($Al_2O_3$). The high-resistance layer 17 may be configured of an appropriate combination of such materials. The high-resistance layer 17 to be used may preferably have a refractive index similar to a refractive index of each of the organic layer 16 and the second electrode layer 18, which is, for example, 1.7 or more, and more preferably 1.9 or more. This improves external quantum efficiency of the light emitting layer of the organic layer 16. For example, thickness of the high-resistance layer 17 may be about 100 nm to 1000 nm both inclusive.

The second electrode layer 18 pairs with the first electrode layer 14 with the organic layer 16 in between, and is, for example, provided on the electron injection layer in common to all the organic EL devices 10R, 10G, and 10B. For example, the second electrode layer 18 may have a function of a cathode electrode together with a function of a light-transmitting layer, and is desirably configured of a material having a high conductivity and a high light transmittance. Hence, the second electrode layer 18 may be configured of, for example, alloy of aluminum (Al), magnesium (Mg), silver (Ag), calcium (Ca), or sodium (Na). In particular, alloy (Mg—Ag alloy) of magnesium and silver is preferred since the alloy has conductivity in a state of a thin film and low absorbance. A ratio of magnesium to silver of the Mg—Ag alloy is desirably, but not limited to, within a range of Mg/Ag=20/1 to 1/1 in a thickness ratio. As the material of the second electrode layer 18, alloy (Al—Li alloy) of aluminum (Al) and lithium (Li), indium tin oxide (ITO), zinc oxide (ZnO), alumina-doped zinc oxide (AZO), gallium-doped zinc oxide (GZO), indium zinc oxide (IZO), indium titanium oxide (ITiO), indium tungsten oxide (IWO), or the like may be used. As described in detail later, since the display unit 1 has an auxiliary electrode layer 25, the second electrode layer 18 is allowed to be reduced in thickness, and has a thickness of about 10 nm to 500 nm both inclusive, for example. The second electrode layer 18 and the high-resistance layer 17 each also have a function of preventing entering of water into the organic layer 16.

The conductive sealing layer 19 covers the entire surface of the device substrate 11 so as to cover the second electrode layer 18, and seals a space between the device panel 10 and the sealing panel 20. The conductive sealing layer 19 prevents entering of water into the display region 110 from the outside, and serves to define a distance between the device panel 10 and the sealing panel 20. The conductive sealing layer 19 further has a function of electrically connecting the third electrode layer 25 to the second electrode layer 18 of each of the organic light emitting devices 10R, 10G, and 10B, and is provided in close contact with each of the third electrode layer 25 and the second electrode layer 18. For example, the conductive sealing layer 19 may contain a plurality of conductive nanoparticles dispersed in a transparent resin. For example, a thermosetting adhesive or an ultraviolet curable adhesive may be sued as the transparent resin. Examples of such an adhesive may include an acrylic adhesive, an epoxy adhesive, an urethane adhesive, a silicone adhesive, a cyanoacrylate adhesive, and the like. For example, the conductive nanoparticles may each include one or more of gold (Au), silver (Ag), Ag nanowire, copper (Cu), aluminum (Al), platinum (Pt), and indium tin oxide (ITO).

Figure 4:
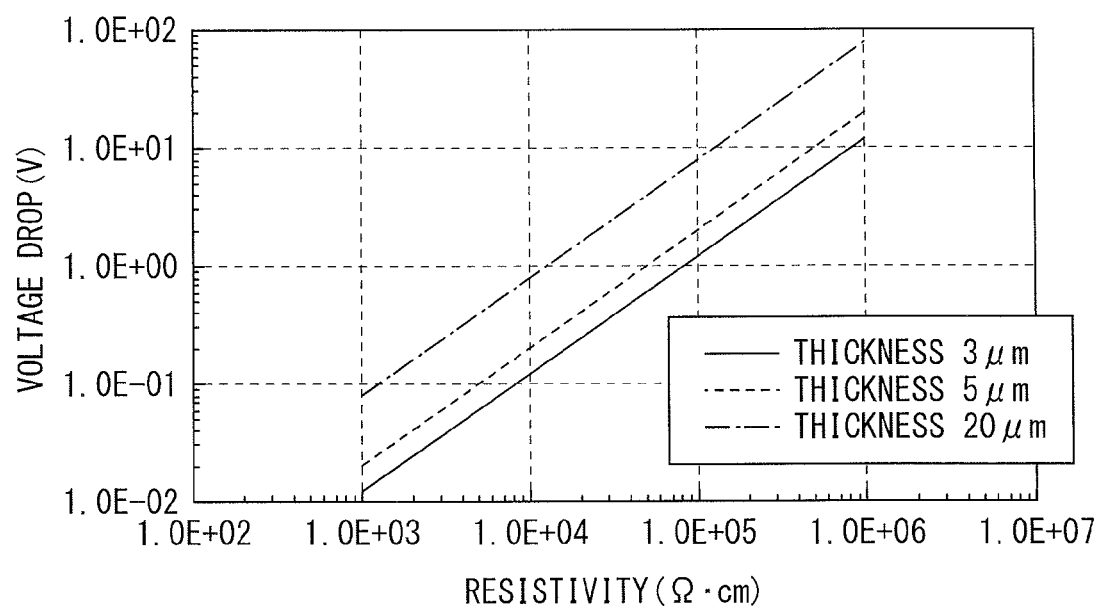
FIG. 4 is a characteristic diagram illustrating a relationship between thickness of a conductive sealing layer illustrated in FIG. 1, resistivity thereof, and voltage drop therein.

For example, thickness of the conductive sealing layer 19 is 3 μm to 20 μm both inclusive. FIG. 4 illustrates a relationship between resistivity [Ω·m] and voltage drop [V] in each thickness of the conductive sealing layer 19, the thickness being set to three levels of 3 μm, 5 μm, and 20 μm. For example, when the thickness of the conductive sealing layer 19 is set to 3 μm, the electric resistivity of the conductive sealing layer 19 is adjusted to be $1\times10^5$ Ω·m or lower, thereby voltage drop in the conductive sealing layer 19 in a thickness direction is allowed to be controlled to be 1 V or less (see FIG. 4). Alternatively, when the thickness of the conductive sealing layer 19 is set to 5 µm, the electric resistivity is adjusted to be $5 \times 10^4$ Ω·m or lower in order to control the voltage drop in the conductive sealing layer 19 in the thickness direction to be 1 V or less. For example, the electric resistivity of the conductive sealing layer 19 is adjusted by appropriately selecting a material and weight of the conductive nanoparticles to be dispersed in the transparent resin. The conductive nanoparticles each have an outer size of 1 µm or less; hence, even if the conductive nanoparticles are dispersed in the transparent resin such as an adhesive, the conductive sealing layer 19 is sufficiently transparent. Furthermore, the conductive nanoparticles each have such a small size, and are therefore sufficiently dispersed in the transparent resin. Consequently, the conductive sealing layer 19 has more uniform light transmittance and conductivity. It is to be noted that the conductive sealing layer 19 may desirably transmit, for example, 80% or more of light generated in the organic layer 16.

The light shielding layer 22 of the sealing panel 20 is formed as a so-called black matrix (BM), and is patterned into, for example, a matrix pattern in correspondence to arrangement of the organic light emitting devices 10R, 10G, and 10B while a plurality of openings 22K are formed therein. The colors of light generated by the organic light emitting devices 10R, 10G, and 10B are individually extracted from the plurality of openings 22K provided in the light shielding layer 22. For example, the light shielding layer 22 may be configured of carbon black. A material having a light shielding property and conductivity, such as chromium or graphite, may be used for the light shielding layer 22. Alternatively, the light shielding layer 22 may be configured of a thin film filter utilizing thin-film interference. For example, the thin film filter may be configured of a stack of one or more thin films of metal, metal nitride, metal oxide, or the like, and thus may cause thin-film interference and attenuate light thereby. Examples of such a thin film filter may include a filter including 65 nm of silicon nitride (SiN), 20 nm of amorphous silicon (α-Si), and 50 nm of molybdenum (Mo) stacked in this order of closeness to the sealing substrate 21, and a filter including 45 nm of molybdenum oxide (MoOx), 10 nm of molybdenum (Mo), 40 nm of molybdenum oxide, and 50 nm of molybdenum (Mo) stacked in this order of closeness to the sealing substrate 21.

For example, the color filter 23 may include a red filter 23R, a green filter 23G, and a blue filter 23B that are arranged in correspondence to a pattern formed by the light shielding layer 22 and the organic light emitting devices 10R, 10G, and 10B. The color filter 23 may be provided at a position overlapping the light shielding layer 22. For example, the red filter 23R, the green filter 23G, and the blue filter 23B are each configured of resin containing a pigment or a dye mixed therein. Through appropriate selection of a type of the pigment or the dye, the red filter 23R, the green filter 23G, and the blue filter 23B are each adjusted such that light transmittance is increased in a wavelength range of each of red, green, and blue. The light transmittance of the color filter 23 is low in wavelength ranges other than the objective wavelength ranges of red, green, and blue. For example, the thickness of the color filter 23 may be 1 µm to 4 µm both inclusive. The color filter 23 may be provided on either surface (a surface opposed to the device substrate 11, or a surface opposite thereto) of the sealing substrate 21, but is preferably provided on the surface opposed to the device substrate 11. This is because the color filter 23 is not exposed to a surface, and is allowed to be protected by the conductive sealing layer 19 and the third electrode layer 25. In addition, a distance between the organic layer 16 and the color filter 23 is reduced, thereby it is possible to avoid entering of light emitted from the organic layer 16 into an adjacent color filter of another color, and avoid formation of a mixed color.

A surface (a surface opposed to the device substrate 11) of the color filter 23 is covered with the overcoat layer 24. The overcoat layer 24 serves as a coating agent that increases flatness of the surface of the color filter 23 and protects the surface, and, for example, may be configured of an organic material such as resin or an inorganic material such as SiO, SiN, or ITO.

The third electrode layer 25 electrically connects the second electrode layer 18 to a feeding point, i.e., an electron supply point, of the second electrode layer 18. For example, the third electrode layer 25 may be provided in common to all the organic EL devices 10R, 10G, and 10B as with the second electrode layer 18. Hence, the third electrode layer 25 is preferably configured of a material having high light transmittance and low electric resistivity. Specifically, the third electrode layer 25 may be configured of a material similar to that of the second electrode layer 18. As described above, the third electrode layer 25 is electrically connected to the second electrode layer 18 via the conductive sealing layer 19. Providing the third electrode layer 25 therefore makes it possible to reduce voltage drop in a display screen.

The second electrode layer 18 is provided so as to cover a light emitting region corresponding to each opening of the insulating film 15 and a device separation region on which the insulating film 15 is to be provided; hence, the second electrode layer 18 itself is low in flatness. Specifically, since the second electrode layer 18 has a large difference in thickness between a large thickness portion and a small thickness portion, if the thickness of the second electrode layer 18 is increased in order to achieve a desired electric resistivity, the thickness of the display unit 1 as a whole tends to be increased. On the other hand, the third electrode layer 25 included in the sealing panel 20 is provided on a surface having a relatively small irregularity, and is therefore high in flatness. Consequently, in the case of achieving a desired electric resistivity, when the third electrode layer 25 is formed of the same material as that of the second electrode layer 18, the thickness of the third electrode layer 25 may be smaller than that in the case of increasing thickness of the second electrode layer 18.

[Method of Manufacturing Display Unit 1]

For example, the display unit 1 is manufactured by separately forming the device panel 10 and the sealing panel 20, and then bonding the device panel 10 to the sealing panel 20. A formation step of the device panel 10 (FIGS. 5A to 5C), a formation step of the sealing panel 20 (FIG. 6), and a step of bonding the device panel 10 to the sealing panel 20 (FIGS. 7A to 7C) are now described in sequence.

[Method of Manufacturing Device Panel 10]

First, the TFT 12, the interlayer insulating film 12A, the wiring 12B, and the planarization layer 13 are formed on the device substrate 11. For example, the planarization layer 13 may be formed by a chemical vapor deposition (CVD) process, a coating process, a sputtering process, various printing processes, and the like. The planarization layer 13 is beforehand provided with connection holes 13A.

Figure 5A:
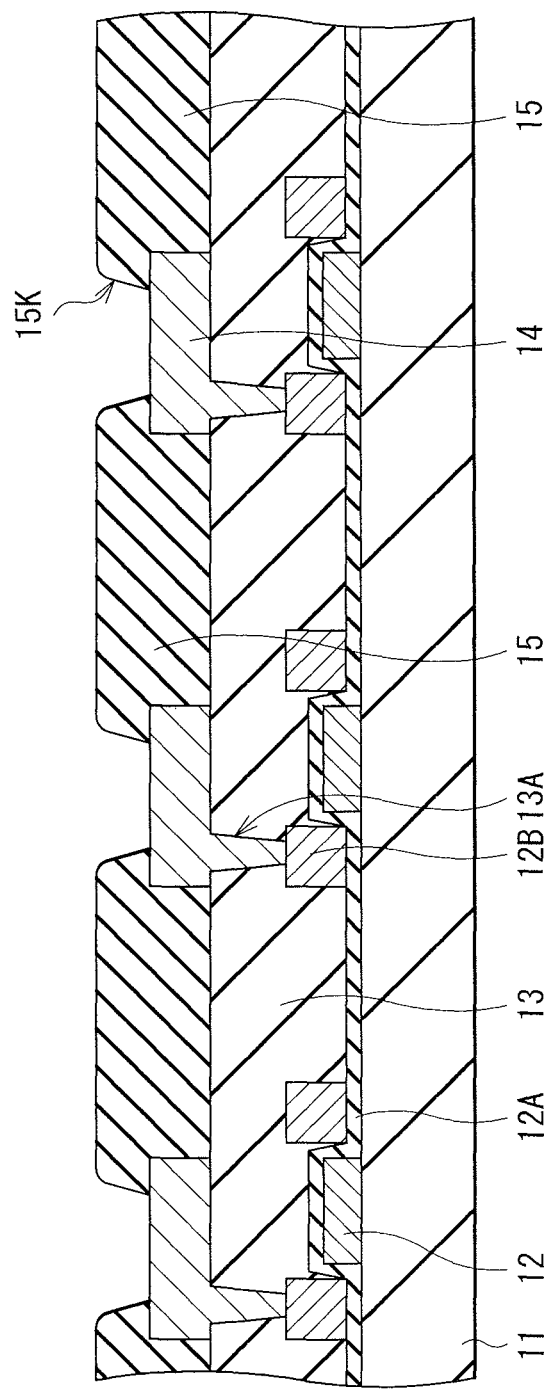
FIG. 5A is a cross-sectional diagram illustrating a step of a method of manufacturing a device panel of the display unit illustrated in FIG. 1.

Subsequently, a conductive film is formed on the planarization layer 13 by, for example, a sputter process, and the conductive film is then patterned by a photolithography process to form the first electrode layer 14. Subsequently, for example, a silicon nitride film may be formed by, for example, a plasma CVD process on the first electrode layer 14 and the planarization layer 13, and then openings 15K may be formed in the silicon nitride film to form the insulating film 15 (FIG. 5A).

Figure 5B:
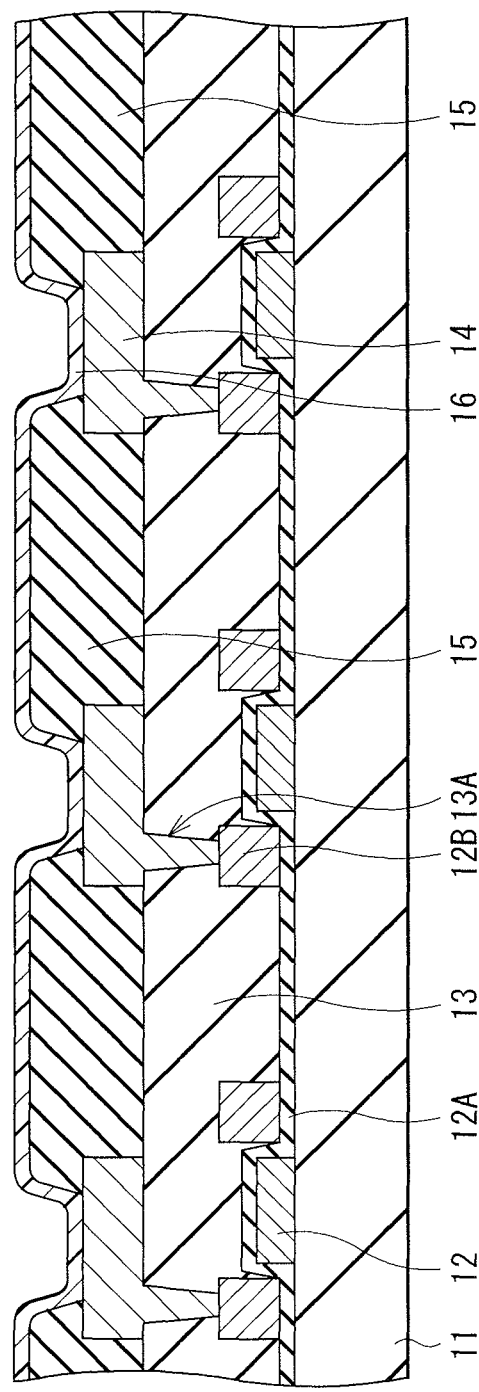
FIG. 5B is a cross-sectional diagram illustrating a step following FIG. 5A.
Figure 5C:
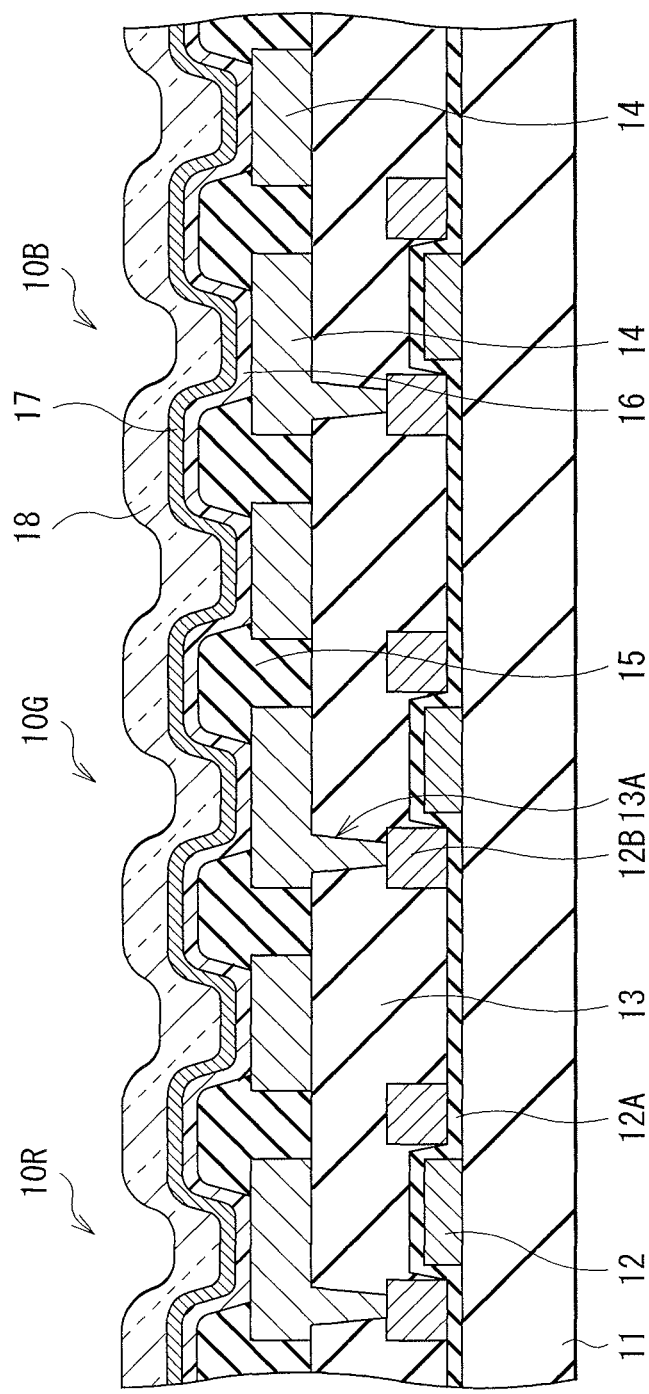
FIG. 5C is a cross-sectional diagram illustrating a step following FIG. 5B.

Subsequently, the organic layer 16 including the light emitting layer, the high-resistance layer 17, and the second electrode layer 18 may be formed over the entire surface of the device substrate 11 by a physical vapor deposition process such as, for example, a vacuum evaporation process (FIGS. 5B and 5C). The organic layer 16, the high-resistance layer 17, and the second electrode layer 18 may be formed by a printing process such as a screen printing process and an inkjet printing process, a laser transfer process, a coating process, or the like. The laser transfer process is a process where a stacked structure of a laser absorption layer and the organic layer 16 is formed on a transfer substrate and is irradiated with laser, so that the organic layer 16 is transferred onto the device substrate 11.

[Method of Manufacturing Sealing Panel 20]

Figure 6:
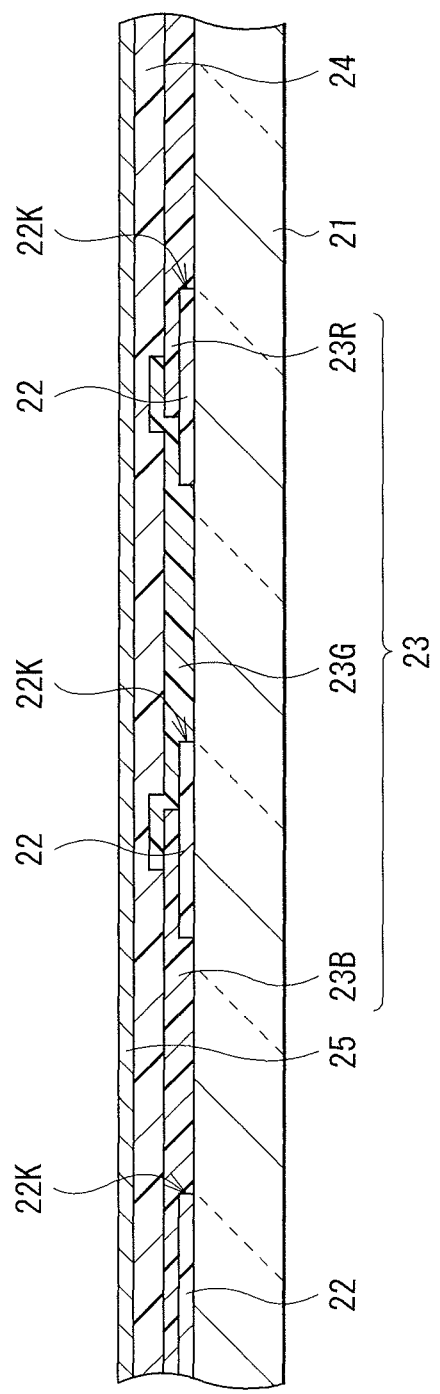
FIG. 6 is a cross-sectional diagram illustrating a step of a method of manufacturing a sealing panel of the display unit illustrated in FIG. 1.

The sealing panel 20 of the display unit 1 may be formed, for example, as follows (FIG. 6). First, a film of a constitutional material of the light shielding layer 22 is formed over the entire surface of the sealing substrate 21, and then the film is patterned into a matrix with a photolithography process, thereby a plurality of openings 22K are formed in correspondence to arrangement of the organic light emitting devices 10R, 10G, and 10B. Subsequently, the red filter 23R, the green filter 23G, and the blue filter 23B are sequentially pattern-formed on the sealing substrate 21 having the light shielding layer 22. Subsequently, the overcoat layer 24 is formed over the entire surface of the sealing substrate 21, and the third electrode layer 25 is formed over the entire surface of the overcoat layer 24. This is the end of fabrication of the sealing panel 20.

[Bonding Step of Device Panel 10 to Sealing Panel 20]

Figure 7A:
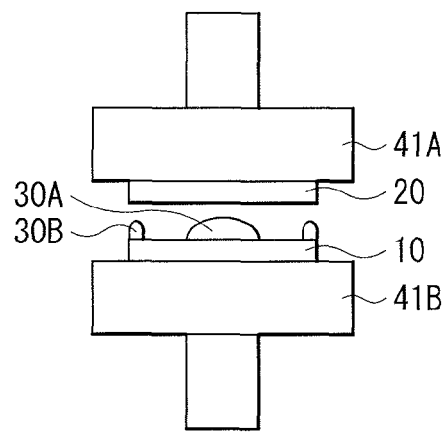
FIG. 7A is a schematic diagram illustrating a step of a method of bonding a device panel to the sealing panel.
Figure 7B:
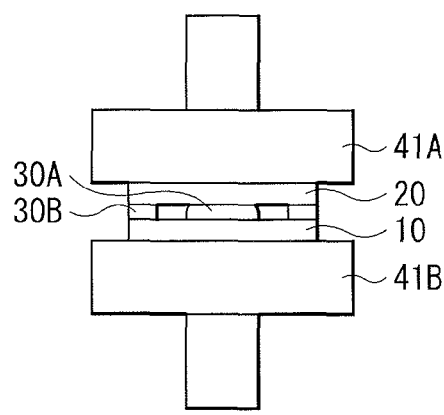
FIG. 7B is a schematic diagram illustrating a step following FIG. 7A.
Figure 7C:
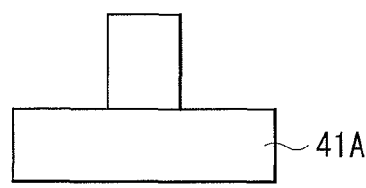
FIG. 7C is a schematic diagram illustrating a step following FIG. 7B.
Figure 7C:
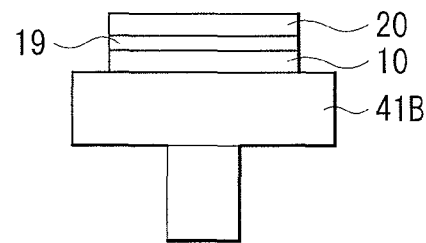

The device panel 10 and the sealing panel 20 formed as above are bonded to each other by a one drop fill (ODF) step as illustrated in FIGS. 7A to 7C, for example. Specifically, a pair of an upper plate 41A and a lower plate 41B are prepared in a vacuum chamber, and the sealing panel 20 is fixed onto a surface, which is opposed to the lower plate 41B, of the upper plate 41A, while the device panel 10 is fixed onto a surface, which is opposed to the upper plate 41A, of the lower plate 41B. Subsequently, the periphery of the device panel 10 on the lower plate 41B is enclosed by a sealing material 30B, and a conductive sealing material 30A is dropped in a region enclosed by the sealing material 30B (FIG. 7A). The conductive sealing material 30A includes an uncured transparent resin, such as the thermosetting adhesive or the ultraviolet curable adhesive, in which a predetermined amount of predetermined conductive nanoparticles are dispersed. In such dropping operation, a plurality of droplets of the conductive sealing material 30A are disposed at equal intervals. Subsequently, the device panel 10 is bonded to the sealing panel 20 in the vacuum chamber (FIG. 7B), and the device panel 10 is then pressed to the sealing panel 20 while the inside of the chamber is adjusted into nitrogen ($N_2$) atmosphere. Consequently, the conductive sealing material 30A is compactly filled into a space between the device panel 10 and the sealing panel 20. Furthermore, the transparent resin included in the conductive sealing material 30A is cured by irradiation of ultraviolet rays or heating, so that the conductive sealing layer 19 is produced (FIG. 7C). This is the end of fabrication of the display unit 1 illustrated in FIG. 1.

[Operation of Display Unit 1]

In the display unit 1, when a drive current corresponding to an image signal of each color is applied to each of the organic light emitting devices 10R, 10G, and 10B, electrons and holes are injected into the organic layer 16 through the first electrode layer 14 and the second electrode layer 18. Such electrons and holes are each recombined in the light emitting layer included in the organic layer 16, so that light emission occurs. The light passes through the second electrode layer 18, the color filter 23, and the sealing substrate 21, and then extracted to the outside. In this way, the display unit 1 performs full-color image display of R, G, and B, for example. In addition, an electric potential corresponding to an image signal is applied to one end of a capacitive element Cs during the image display operation, thereby charge corresponding to the image signal is accumulated in the capacitive element Cs.

[Functions and Effects of Display Unit 1]

Figure 19:
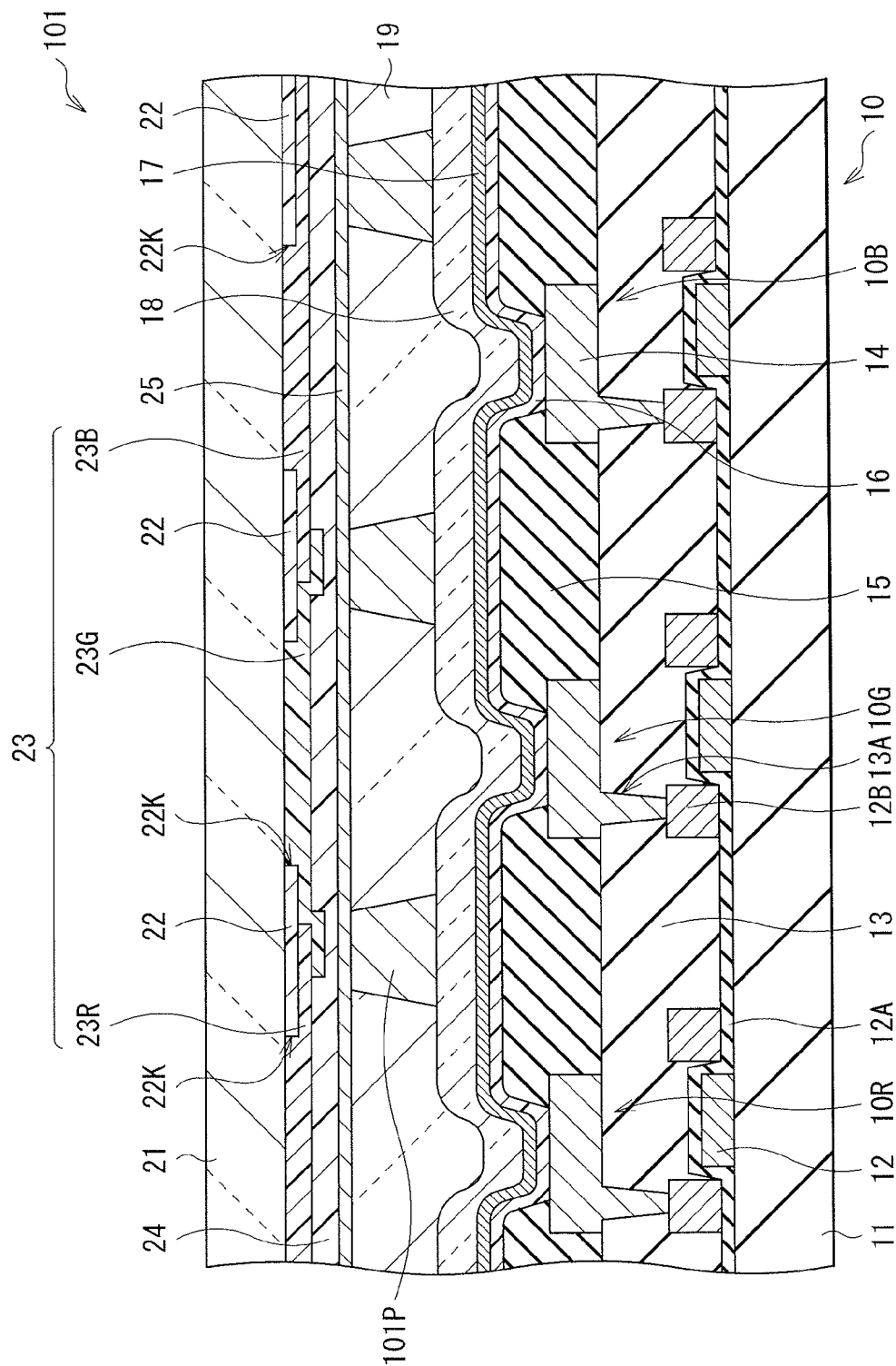
FIG. 19 is a cross-sectional diagram illustrating a configuration of a display unit as a comparative example.

In the display unit 1, each of the organic light emitting devices 10R, 10G, and 10B has a stacked structure in which the first electrode layer 14, the organic layer 16, the second electrode layer 18, the conductive sealing layer 19, and the third electrode layer 25 are stacked in this order. The second electrode layer 18 is electrically connected to the third electrode layer 25 via the conductive sealing layer 19. Hence, voltage drop in the second electrode layer 18 is reduced compared with a case where the third electrode layer 25 is not provided. Even if the third electrode layer 25 is provided, the display unit 1 has a simple configuration compared with, for example, a display unit 101 as a comparative example illustrated in FIG. 19, and is thus excellent in productivity. In the display unit 101 of FIG. 19, an insulating resin layer is provided in place of the conductive sealing layer 19, and a conductive pillar 101P for electrical connection with the third electrode layer 25 is vertically provided in a partial region of the second electrode layer 18. In this case, a step for performing such a process is necessary, and high accuracy is necessary for alignment between the conductive pillar 101P and the black matrix (light shielding layer 22) of the sealing panel 20. However, the display unit 1 eliminates such necessity, and achieves simplification. In this way, in the display unit 1, a space between the second electrode layer 18 and the third electrode layer 25 is sealed by the conductive sealing layer 19. Hence, it is possible to reduce voltage drop in an in-plane direction without reducing light transmittance though the display unit 1 has a simple configuration. Consequently, even if the display unit 1 is increased in size, the display unit 1 is excellent in mass-productivity, and secures high operation performance and reliability.

Modification of First Embodiment

Figure 8:
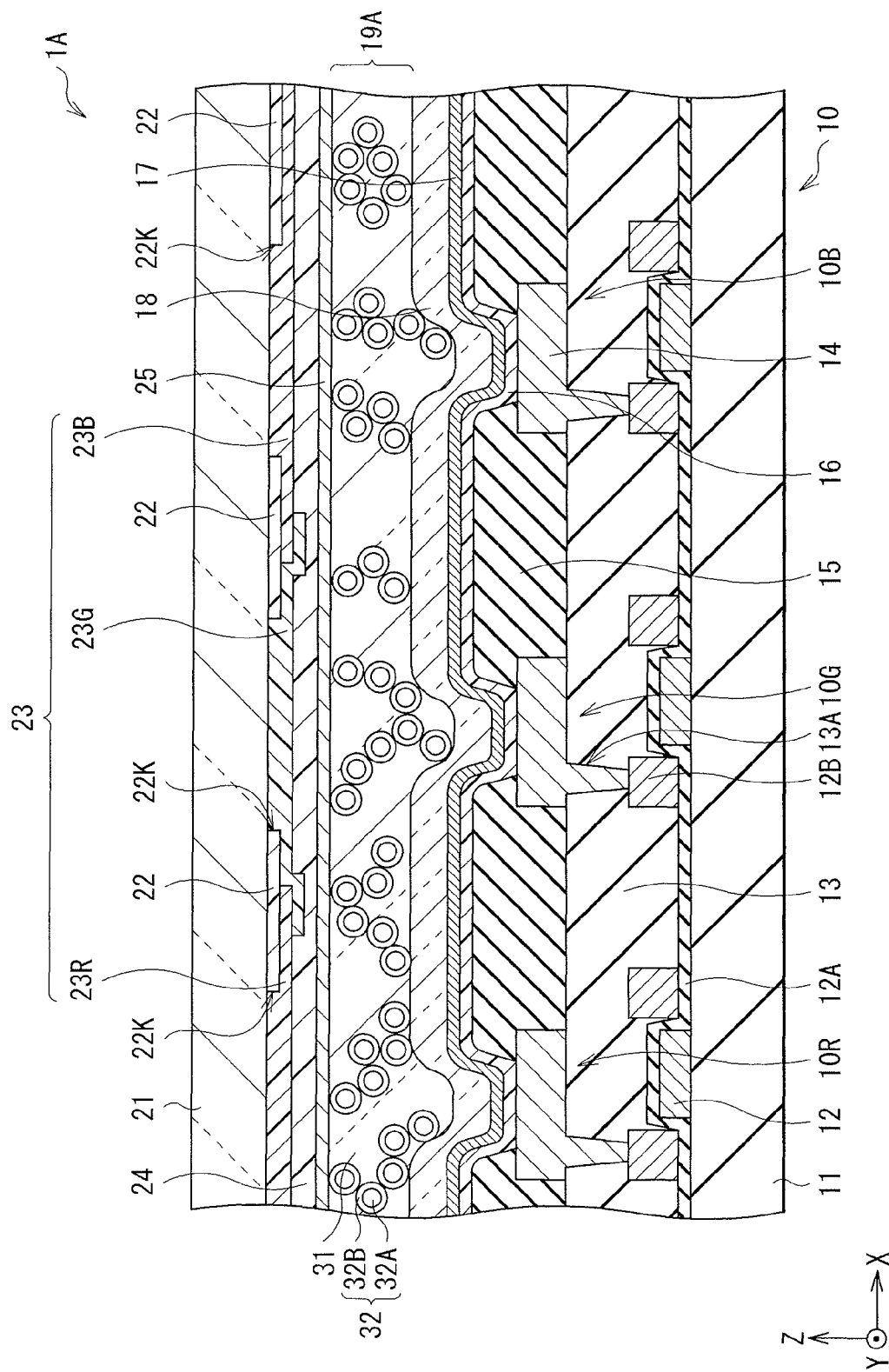
FIG. 8 is a cross-sectional diagram illustrating a modification of the display unit illustrated in FIG. 1.

The first embodiment has been exemplarily described with the conductive sealing layer 19 in which a plurality of conductive nanoparticles are dispersed in the transparent resin such as the thermosetting adhesive or the ultraviolet curable adhesive, for example. On the other hand, a conductive sealing layer 19A is allowed to be used as in a display unit 1A of this modification illustrated in FIG. 8. The conductive sealing layer 19A includes a plurality of conductive fillers 32 dispersed in a transparent resin 31. For example, the transparent resin 31 may be a thermosetting adhesive or an ultraviolet curable adhesive as with the transparent resin of the conductive sealing layer 19. On the other hand, for example, the conductive fillers 32 may each be configured of a particulate transparent polymer material 32A covered with a transparent conductive film 32B. For example, an acrylic particle may be used as the transparent polymer material 32A. The transparent conductive film 32B is configured of the same type of material as a constitutional material of the second electrode layer 18, such as ITO, ZnO, or IZO. While FIG. 8 schematically illustrates an existing state of the conductive fillers 32, positions, size, and the number of the conductive fillers 32 are not limited to those in FIG. 8. The display unit 1A is fabricated in the same way as the display unit 1 of the first embodiment. In the display unit 1A, harmonizing a refractive index of the transparent resin 31 with a refractive index of the conductive filler 32 makes it possible to prevent scattering of light from the organic layer 16 when the light passes through the conductive sealing layer 19A. It is to be noted that outer size of the conductive filler 32 may be preferably smaller than the thickness of the conductive sealing layer 19A. Such a display unit 1A also expectably exhibits functions and effects similar to those of the display unit 1.

Second Embodiment

Configuration of Display Unit 2

Figure 9:
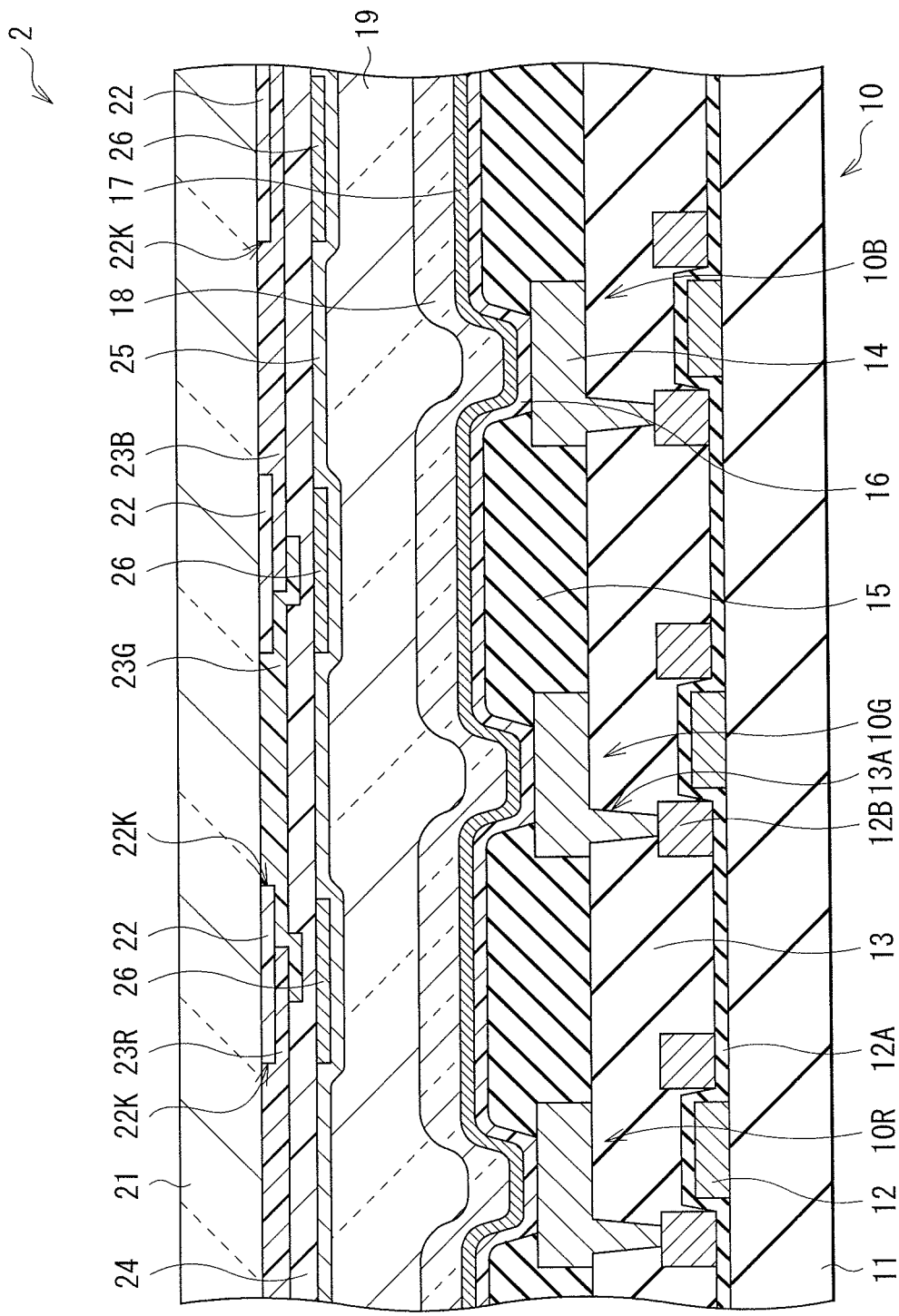
FIG. 9 is a cross-sectional diagram illustrating a configuration of a display unit according a second embodiment of the present application.

FIG. 9 illustrates a relevant-part sectional configuration of an organic EL display unit (display unit 2) as a second embodiment of the present application. The display unit 2 has a configuration similar to that of the display unit 1 of the first embodiment except that an auxiliary wiring layer 26 is provided.

For example, the auxiliary wiring layer 26 may be selectively provided on a surface of the overcoat layer 24 of the sealing panel 20 in a stripe or grid pattern in correspondence to the device separation region, on which the insulating film 15 is provided, of the device panel 10 in the display region 110. The auxiliary wiring layer 26 is in conduction with the second electrode layer 18 via the third electrode layer 25 covering the auxiliary wiring layer 26 and the conductive sealing layer 19. The auxiliary wiring layer 26 is preferably configured of a material that is highly conductive and is less likely to be oxidized in air. Specifically, examples of the constitutional material of the auxiliary wiring layer 26 may include aluminum (Al), silver (Ag), gold (Au), copper (Cu), chromium (Cr), zinc (Zn), iron (Fe), tungsten (W), and cobalt (Co). Aluminum is relatively easily oxidized. Hence, aluminum is preferably covered by molybdenum (Mo), titanium (Ti), or the like to configure the auxiliary wiring layer 26.

[Functions and Effects of Display Unit 2]

Providing such an auxiliary wiring layer 26 makes it possible to further suppress occurrence of voltage drop in a display screen without reducing light emission performance. One reason for this is described below.

In general, the light-transmissive conductive film used as the second electrode layer in the top-emission display unit has high resistivity. Wiring resistance therefore increases at a large rate in accordance with a distance from a feeding point to each pixel (each organic light emitting device). On the other hand, the second electrode layer preferably has a smaller thickness. This is because since the light-transmissive conductive film such as an ITO film easily absorbs light particularly in a short-wavelength region (a region of 450 nm or less), blue display light may be extracted to the outside with insufficient intensity compared with other color light. In such a case, it is possible to compensate the insufficient intensity of blue display light by increasing intensity of light of a blue light source. However, power consumption is increased. Moreover, if the thickness of the second electrode layer is decreased in order to increase light transmittance, electric resistance of the second electrode layer is further increased in accordance with the thickness of the second electrode layer. As a result, as the distance between the pixel and the feeding point increases, an effective voltage applied to the organic light emitting device is notably lowered, and luminance may be decreased.

In the display unit 2, therefore, the auxiliary wiring layer 26 is provided in addition to the third electrode layer 25 as a layer that serves as a current bypass between the second electrode layer 18 and a feeding point thereof, thereby such voltage drop is reduced. For example, the auxiliary wiring layer 26 may be preferably provided so as to overlap the light shielding layer 22. A conductive light shielding layer 22 may be used so that the light shielding layer 22 also serves as the auxiliary wiring layer 26.

In the display unit 2, the auxiliary wiring layer 26 is provided in the sealing panel 20 instead of the device panel 10. It is therefore possible to separate a formation process of the auxiliary wiring layer 26 from a formation process of the organic light emitting devices 10R, 10G, and 10B. In contrast, for example, when the auxiliary wiring layer may be directly formed on the second electrode layer 18, it is concerned that a load, which is caused by heat during formation of the auxiliary wiring layer (for example, heat caused by sputter or evaporation) or water (for example, a developer used in a photolithography process), is also applied to the organic layer 16. The display unit 2 of the second embodiment is allowed to avoid such a difficulty.

Application Examples

Application examples of the above-described display units (the display units 1, 1A, and 2) to electronic units are now described. Examples of the electronic units may include a television apparatus, a digital camera, a notebook personal computer, a mobile terminal device such as a mobile phone, and a video camcorder. In other words, the display units are each applicable to electronic units in various fields for displaying externally-received or internally-generated image signals as still or video images.

[Module]

Figure 10:
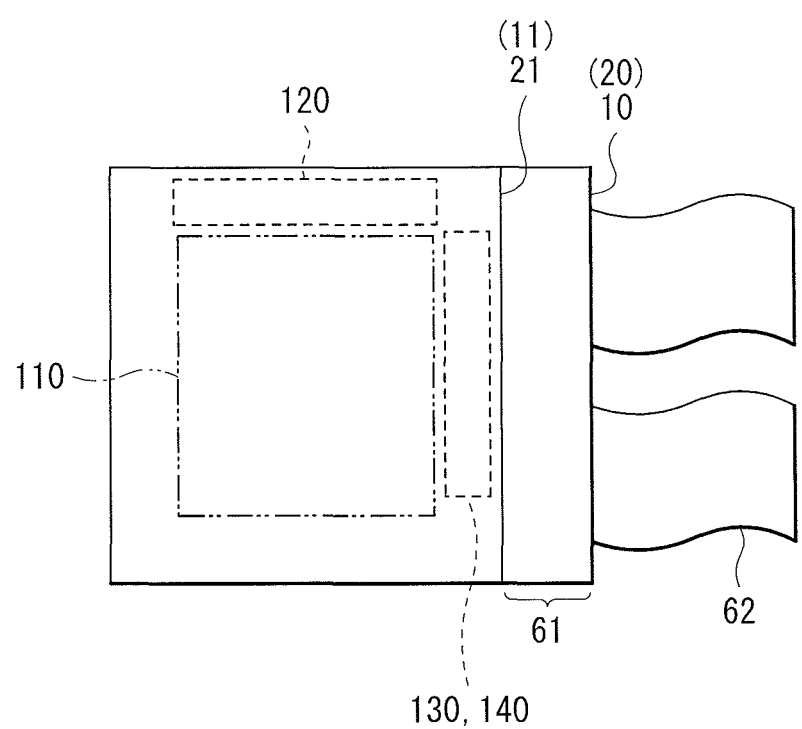

Each of the above-described display units may be built in various electronic systems such as application examples 1 to 7 described below, for example, as a module shown in FIG. 10. In the module, for example, one side of the device panel 10 or the sealing panel 20 has a region 61 exposed from the sealing substrate 21 or the device substrate 11, and external connection terminals (a first periphery electrode, a second periphery electrode, and the like) are provided on the exposed region 61 by extending wirings for the signal line drive circuit 120, the scan line drive circuit 130, and the power supply line drive circuit 140. The external connection terminals may be attached with a flexible printed circuit (FPC) 62 for input/output of signals.

Application Example 1

Figure 11A:
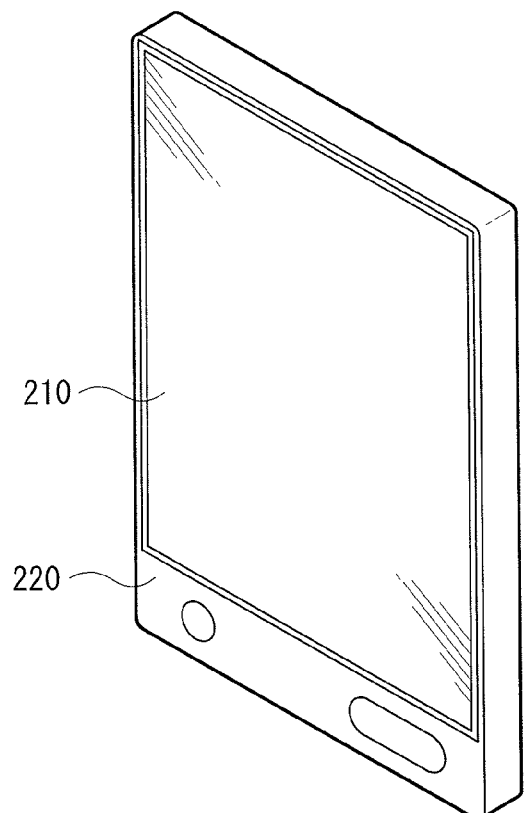
Figure 11B:
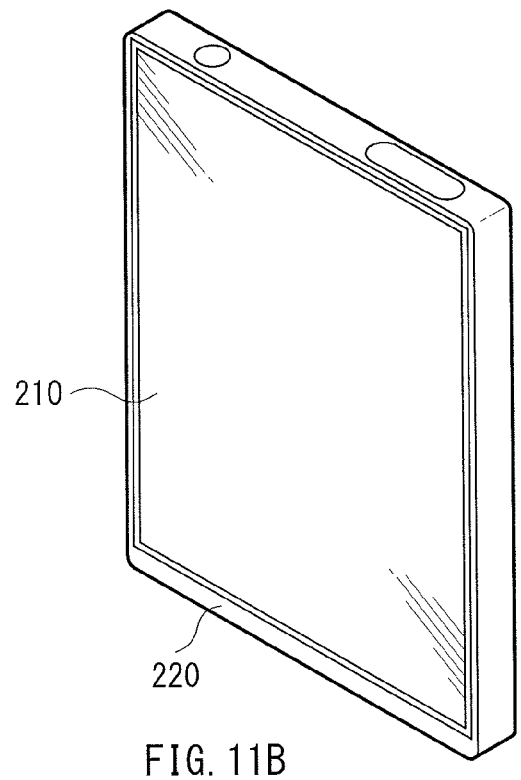
FIG. 11B is another perspective diagram illustrating appearance of the application example 1.

FIGS. 11A and 11B each illustrate appearance of an electronic book to which the display unit according to any of the above-described embodiments is applied. The electronic book may have, for example, a display section 210, a non-display section 220. The display section 210 may be configured of the display unit according to any of the above-described embodiments.

Application Example 2

Figure 12:
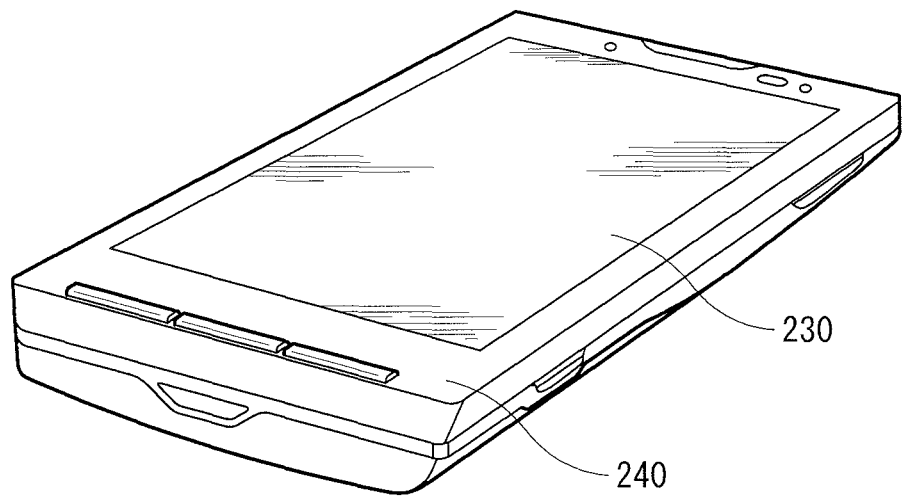
FIG. 12 is a perspective diagram illustrating appearance of application example 2.

FIG. 12 illustrates appearance of a smartphone to which the display unit according to any of the above-described embodiments is applied. The smartphone may have, for example, a display section 230 and a non-display section 240. The display section 230 may be configured of the display unit according to any of the above-described embodiments.

Application Example 3

Figure 13:
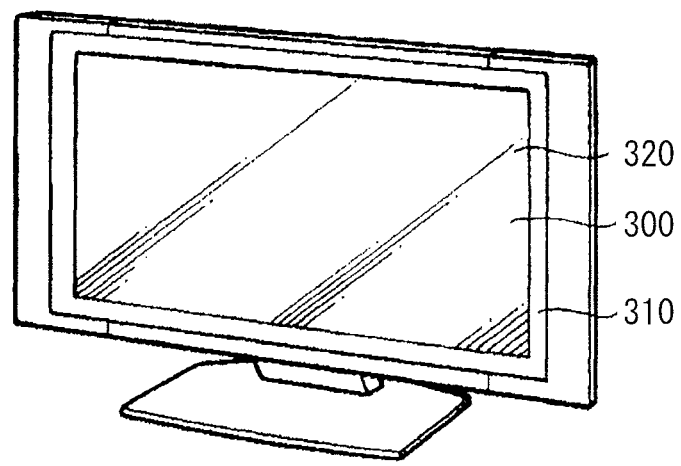
FIG. 13 is a perspective diagram illustrating appearance of application example 3.

FIG. 13 illustrates appearance of a television apparatus to which the display unit according to any of the above-described embodiments is applied. This television apparatus may have, for example, an image display screen section 300 including a front panel 310 and filter glass 320. The image display screen section 300 may be configured of the display unit according to any of the above-described embodiments.

Application Example 4

Figure 14A:
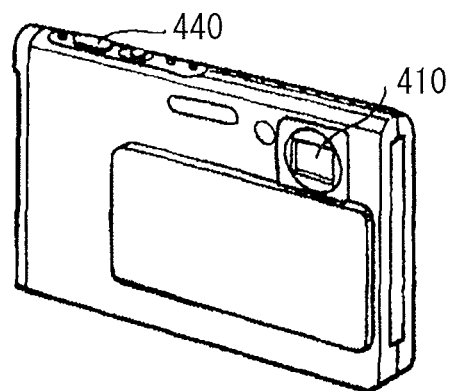
FIG. 14A is a perspective diagram illustrating appearance of application example 4 as viewed from its front side.
Figure 14B:
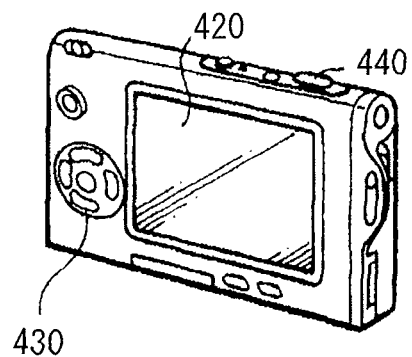
FIG. 14B is a perspective diagram illustrating appearance of the application example 4 as viewed from its back side.

FIGS. 14A and 14B each illustrate appearance of a digital camera to which the display unit according to any of the above-described embodiments is applied. The digital camera may have, for example, a light emitting section 410 for flash, a display section 420, a menu switch 430, and a shutter button 440. The display section 420 may be configured of the display unit according to any of the above-described embodiments.

Application Example 5

Figure 15:
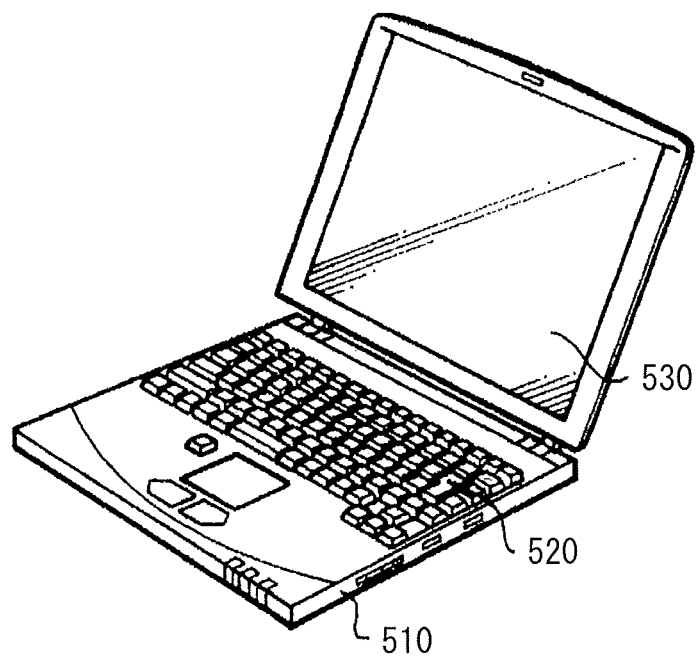
FIG. 15 is a perspective diagram illustrating appearance of application example 5.

FIG. 15 illustrates appearance of a notebook personal computer to which the display unit according to any of the above-described embodiments is applied. The notebook personal computer may have, for example, a main body 510, a keyboard 520 for input operation of characters and the like, and a display section 530 that displays images. The display section 530 may be configured of the display unit according to any of the above-described embodiments.

Application Example 6

Figure 16:
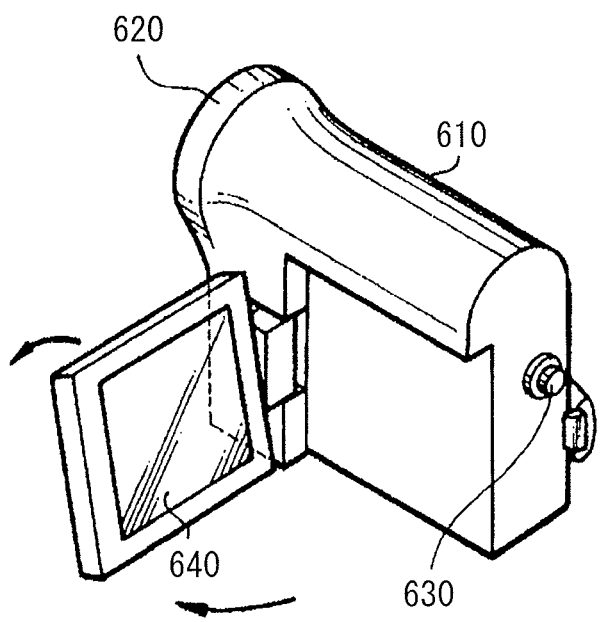
FIG. 16 is a perspective diagram illustrating appearance of application example 6.

FIG. 16 illustrates appearance of a video camcorder to which the display unit according to any of the above-described embodiments is applied. The video camcorder may have, for example, a main body section 610, an object-shooting lens 620 provided on a front side face of the main body section 610, a start/stop switch 630 for shooting, and a display section 640. The display section 640 may be configured of the display unit according to any of the above-described embodiments.

Application Example 7

Figure 17A:
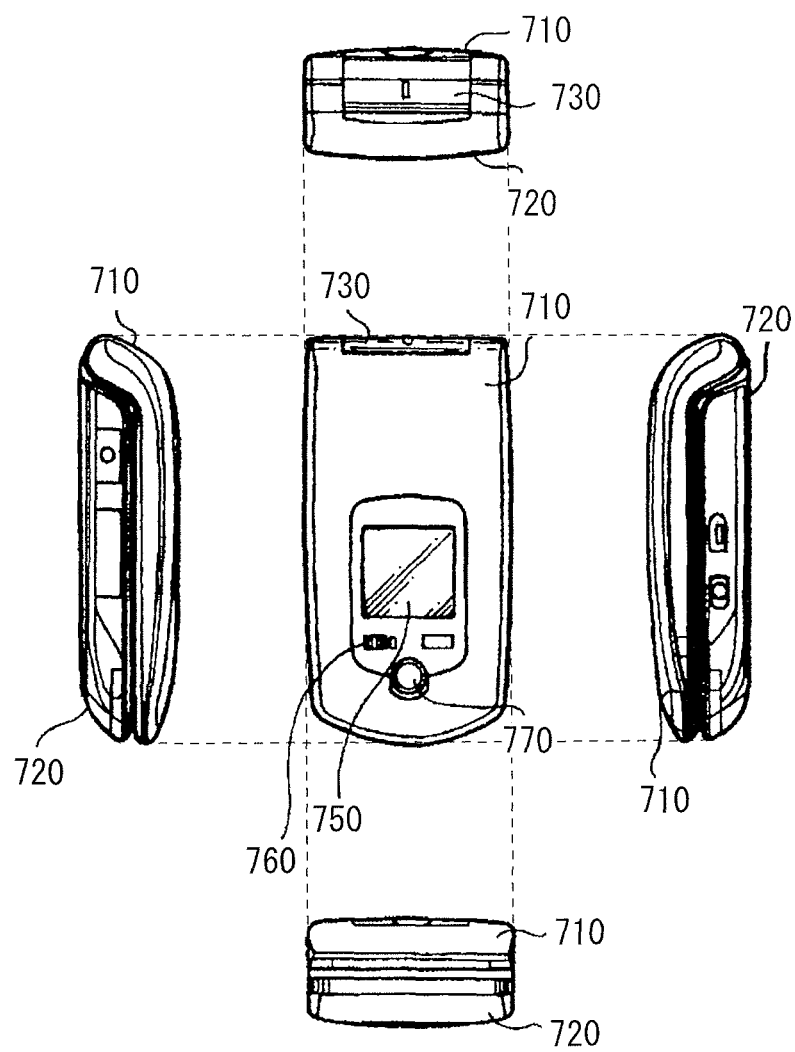
FIG. 17A is a diagram illustrating application example 7 in a closed state.
Figure 17B:
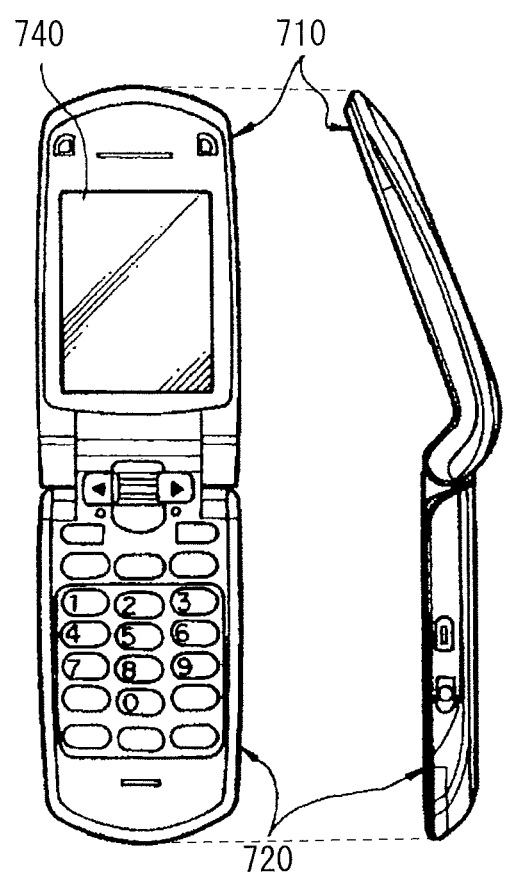
FIG. 17B is a diagram illustrating application example 7 in an opened state.

FIGS. 17A and 17B each illustrate appearance of a mobile phone to which the display unit according to any of the above-described embodiments is applied. For example, the mobile phone may be configured of an upper housing 710 and a lower housing 720 connected to each other by a hinge section 730, and may have a display 740, a sub display 750, a picture light 760, and a camera 770. The display 740 or the sub display 750 may be configured of the display unit according to any of the above-described embodiments.

Figure 18:
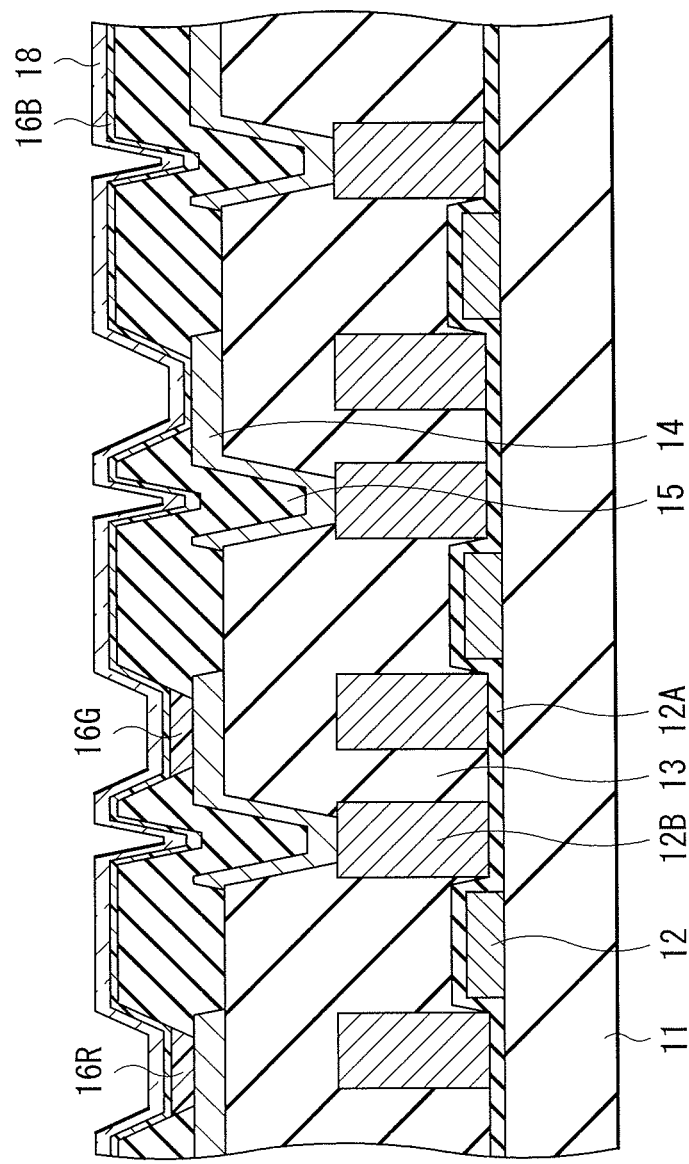

Although the present application has been described with the example embodiments and the modification thereof hereinbefore, the technology is not limited thereto, and various modifications or alterations thereof may be made. For example, although the example embodiments and the modification thereof have been described with an exemplary case where all the organic light emitting devices 10R, 10G, and 10B have the common organic layer 16, one or more of the layers of the organic layer 16 may be common to the organic light emitting devices 10R, 10G, and 10B. For example, as illustrated in FIG. 18, a red light emitting layer 16R and a green light emitting layer 16G may be provided for the organic light emitting devices 10R and 10G, respectively, while a blue light emitting layer 16B may be provided in common to the organic light emitting devices 10R, 10G, and 10B. In addition, the light emitting layer may be separately provided for the individual organic light emitting devices 10R, 10G, and 10B, while the hole injection layer and the like may be provided in common to the organic light emitting devices 10R, 10G, and 10B.

In addition, although the example embodiments and the modification thereof have been described with an exemplary case where the red pixel, the green pixel, and the blue pixel are disposed while the red filter 23R, the green filter 23G, and the blue filter 23B are provided as the color filter 23, a yellow pixel or a white pixel may be added thereto. This makes it possible to increase luminance.

Furthermore, although example embodiments and the modification thereof have been described with an exemplary case where the high-resistance layer 17 and the overcoat layer 24 are provided, one or both of the high-resistance layer and the overcoat layer may be omitted.

While the material and the thickness of each layer, and the film formation process and the film formation condition of each layer have been described in the example embodiments and the modification thereof, these are not limitative. In other words, other materials and thicknesses may be used, or other film formation processes and film formation conditions may be used.

Furthermore, although the example embodiments and the modification thereof have been described with specific configurations of the display units 1, 1A, and 2, the display unit according to the present disclosure is not limited to a display unit having all of the illustrated components. In addition, some of the components may be replaced with other components.

Furthermore, the technology encompasses any possible combination of some or all of the various embodiments described herein and incorporated herein.

It is possible to achieve at least the following configurations from the above-described example embodiments of the disclosure.

(1) A light emitting device having a stacked structure, the stacked structure including, in recited order:
   a first electrode layer;
   an organic layer including a light emitting layer;
   a second electrode layer;
   a conductive sealing layer; and
   a third electrode layer.
(2) The light emitting device according to (1), wherein the conductive sealing layer contains a plurality of conductive nanoparticles dispersed in a transparent resin.
(3) The light emitting device according to (2), wherein the transparent resin is one of a thermosetting adhesive and an ultraviolet curable adhesive, and
   the conductive nanoparticles each include one or more of gold (Au), silver (Ag), Ag nano-wire, copper (Cu), aluminum (Al), platinum (Pt), and indium tin oxide (ITO).
(4) The light emitting device according to (1), wherein the conductive sealing layer includes a plurality of conductive fillers dispersed in a transparent resin.
(5) The light emitting device according to (4), wherein the transparent resin includes one of a thermosetting adhesive and an ultraviolet curable adhesive, and
   the conductive fillers are each configured of a transparent polymer material covered with a transparent conductive film.
(6) A display unit, including:
   a plurality of light emitting devices on a substrate,
   each of the plurality of light emitting devices having a stacked structure, the stacked structure including, in recited order,
     a first electrode layer,
     an organic layer including a light emitting layer,
     a second electrode layer,
     a conductive sealing layer, and
     a third electrode layer.

(7) The display unit according to (6), wherein the second electrode layer, the conductive sealing layer, and the third electrode layer are each a common layer shared by the plurality of light emitting devices.

(8) The display unit according to (7), further including:
a separation region allowing the light emitting layer to be separately provided for the individual light emitting devices; and
a light emitting region occupied by the light emitting layer, wherein the separation region is provided with an auxiliary wiring layer connected to the third electrode layer.

(9) A method of manufacturing a light emitting device, the method including:
forming a stack of a first electrode layer, an organic layer including a light emitting layer, and a second electrode layer in this order on a first substrate;
forming a third electrode layer on a second substrate; and
bonding the second electrode layer to the third electrode layer with a conductive sealing layer therebetween.

(10) The method according to (9), wherein a transparent resin including one of a thermosetting adhesive and an ultraviolet curable adhesive, in which a plurality of conductive nanoparticles or a plurality of conductive fillers are dispersed, is cured by heating or irradiation of ultraviolet rays to produce the conductive sealing layer.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention is claimed as follows:

1. A light emitting device having a stacked structure, the stacked structure comprising, in recited order:
a first electrode layer;
an organic layer including a light emitting layer;
a second electrode layer;
a conductive sealing layer; and
a third electrode layer,
wherein the conductive sealing layer is a continuous layer without an opening adjacent to the light emitting device.

2. The light emitting device according to claim 1, wherein the conductive sealing layer contains a plurality of conductive nanoparticles dispersed in a transparent resin.

3. The light emitting device according to claim 2, wherein the transparent resin is one of a thermosetting adhesive and an ultraviolet curable adhesive, and
the conductive nanoparticles each include one or more of gold (Au), silver (Ag), Ag nano-wire, copper (Cu), aluminum (Al), platinum (Pt), and indium tin oxide (ITO).

4. The light emitting device according to claim 1, wherein the conductive sealing layer includes a plurality of conductive fillers dispersed in a transparent resin.

5. The light emitting device according to claim 4, wherein the transparent resin includes one of a thermosetting adhesive and an ultraviolet curable adhesive, and
the conductive fillers are each configured of a transparent polymer material covered with a transparent conductive film.

6. The light emitting device according to claim 1, further comprising a high resistance layer provided on the organic layer, the high resistance layer is further inserted between the organic layer and the second electrode layer.

7. The light emitting device according to claim 6, wherein the high resistance layer has a higher electric resistance than each of the first electrode layer and the second electrode layer.

8. The light emitting device according to claim 6, wherein the high resistance layer is configured to have at least one of electron transport function and electron injection function.

9. The light emitting device according to claim 1, wherein the second electrode layer is low in flatness.

10. The light emitting device according to claim 9, wherein the third electrode layer is high in flatness.

11. The light emitting device according to claim 1, wherein the conductive sealing layer is configured to transmit 80% or more of light from the light emitting device.

12. The light emitting device according to claim 1, wherein the conductive sealing layer is configured to electrically connect the second electrode layer to the third electrode layer.

13. A display unit, comprising:
a plurality of light emitting devices on a substrate,
each of the plurality of light emitting devices having a stacked structure, the stacked structure including, in recited order,
a first electrode layer,
an organic layer including a light emitting layer,
a second electrode layer,
a conductive sealing layer, and
a third electrode layer,
wherein the conductive sealing layer is a continuous layer without an opening adjacent to the light emitting device.

14. The display unit according to claim 13, wherein the second electrode layer, the conductive sealing layer, and the third electrode layer are each a common layer shared by the plurality of light emitting devices.

15. The display unit according to claim 14, further comprising:
a separation region allowing the light emitting layer to be separately provided for the individual light emitting devices; and
a light emitting region occupied by the light emitting layer, wherein the separation region is provided with an auxiliary wiring layer connected to the third electrode layer.

16. The display unit according to claim 13, further comprising a high resistance layer provided on the organic layer, the high resistance layer is further inserted between the organic layer and the second electrode layer.

17. The display unit according to claim 13, wherein the second electrode layer is low in flatness.

18. The display unit according to claim 17, wherein the third electrode layer is high in flatness.

19. A method of manufacturing a light emitting device, the method comprising:
forming a stack of a first electrode layer, an organic layer including a light emitting layer, and a second electrode layer in this order on a first substrate;
forming a third electrode layer on a second substrate; and
bonding the second electrode layer to the third electrode layer with a conductive sealing layer therebetween,
wherein the conductive sealing layer is a continuous layer without an opening adjacent to the light emitting device.

20. The method according to claim 19, wherein a transparent resin including one of a thermosetting adhesive and an ultraviolet curable adhesive, in which a plurality of conductive nanoparticles or a plurality of conductive fillers are dispersed, is cured by heating or irradiation of ultraviolet rays to produce the conductive sealing layer.

21. The method according to claim 19, further comprising a step of forming a high resistance layer on the organic layer, the high resistance layer is further inserted between the organic layer and the second electrode layer.

22. The method according to claim 19, wherein the second electrode layer is low in flatness.

23. The method according to claim 22, wherein the third electrode layer is high in flatness.

* * * * *